US010727980B2

(12) United States Patent
Peyla et al.

(10) Patent No.: US 10,727,980 B2
(45) Date of Patent: Jul. 28, 2020

(54) LUMB SERVICE MODES FOR FM HD RADIO BROADCASTS

(71) Applicant: Ibiquity Digital Corporation, Columbia, MD (US)

(72) Inventors: Paul J. Peyla, Elkridge, MD (US); Brian W. Kroeger, Sykesville, MD (US); Jeffrey S. Baird, Columbia, MD (US)

(73) Assignee: Ibiquity Digital Corporation, Columbia, MD (US)

( * ) Notice: Subject to any disclaimer, the term of this patent is extended or adjusted under 35 U.S.C. 154(b) by 18 days.

(21) Appl. No.: 15/983,244

(22) Filed: May 18, 2018

(65) Prior Publication Data

US 2019/0349132 A1 Nov. 14, 2019

Related U.S. Application Data

(63) Continuation-in-part of application No. 15/973,721, filed on May 8, 2018, now abandoned.

(51) Int. Cl.
*H04L 1/00* (2006.01)
*H04L 27/34* (2006.01)
*H03M 13/03* (2006.01)

(52) U.S. Cl.
CPC .......... *H04L 1/0071* (2013.01); *H04L 1/0013* (2013.01); *H04L 1/0041* (2013.01); *H04L 27/34* (2013.01); *H03M 13/03* (2013.01)

(58) Field of Classification Search
CPC ... H04L 1/0071; H04L 1/0013; H04L 1/0041; H04L 27/34; H03M 13/03

(Continued)

(56) References Cited

U.S. PATENT DOCUMENTS 5,734,676 A * 3/1998 Dingsor ............... H03D 3/006
375/222
5,742,641 A * 4/1998 Dingsor ............... H04L 27/142
375/222

(Continued)

OTHER PUBLICATIONS

"International Application Serial No. PCT/US2019/031046, International Search Report dated Jul. 10, 2019", 5 pgs.

(Continued)

*Primary Examiner* — John J Tabone, Jr.
(74) *Attorney, Agent, or Firm* — Schwegman Lundberg & Woessner, P.A.

(57) ABSTRACT

A radio transmitter comprises transmitting circuitry and processing circuitry. The transmitting circuitry broadcasts a frequency modulation (FM) in-band on-channel (IBOC) radio signal, wherein the FM IBOC radio signal includes multiple subcarriers grouped into multiple frequency partitions. The processing circuitry is configured to receive input bits for transmitting; encode and puncture the input bits using forward error correction (FEC) encoding; distribute encoded input bits between a main encoded component and a backup encoded component, wherein encoded bits of the backup encoded component are delayed for a specified duration relative to encoded bits of the main encoded component; allocate the encoded input bits of the main and backup encoded components into frequency diverse sidebands of the FM IBOC radio signal; and modulate the encoded input bits for transmitting using the frequency diverse sidebands of the FM IBOC radio signal, wherein the modulation is a type of quadrature amplitude modulation (QAM).

30 Claims, 26 Drawing Sheets

(58) Field of Classification Search
USPC .................. 714/755, 784, 795; 379/101.01; 375/222; 381/15, 2, 22, 23; 704/229
See application file for complete search history.

(56) References Cited

U.S. PATENT DOCUMENTS

| | | | | |
|---|---|---|---|---|
| 5,751,114 A * | 5/1998 | Dingsor | ............... | H03J 7/04 375/222 |
| 5,838,799 A * | 11/1998 | Cioffi | ............... | H04B 1/16 381/2 |
| 6,622,007 B2 * | 9/2003 | Linden | ............... | H04H 20/30 455/12.1 |
| 6,721,337 B1 * | 4/2004 | Kroeger | ............... | H04H 20/30 370/204 |
| 7,305,043 B2 * | 12/2007 | Milbar | ............... | H04H 20/30 375/295 |
| 7,352,817 B2 * | 4/2008 | Milbar | ............... | H03M 13/271 375/259 |
| 8,595,590 B1 * | 11/2013 | Vojcic | ............... | H04L 1/0041 714/758 |
| 8,792,594 B2 * | 7/2014 | Vojcic | ............... | H04L 1/005 375/340 |
| 9,191,256 B2 * | 11/2015 | Vojcic | ............... | H04L 1/005 |
| 9,391,643 B2 * | 7/2016 | Vojcic | ............... | H04L 1/005 |
| 9,455,861 B2 * | 9/2016 | Vojcic | ............... | H04L 1/005 |
| 9,461,863 B2 * | 10/2016 | Vojcic | ............... | H04L 1/005 |
| 9,509,341 B2 * | 11/2016 | Vojcic | ............... | H04L 1/0041 |
| 2004/0063399 A1 * | 4/2004 | Milbar | ............... | H03M 13/271 455/3.01 |
| 2004/0076188 A1 * | 4/2004 | Milbar | ............... | H04H 20/30 370/514 |
| 2014/0153625 A1 * | 6/2014 | Vojcic | ............... | H04L 1/005 375/224 |
| 2014/0281833 A1 * | 9/2014 | Kroeger | ............... | H03M 13/1102 714/776 |
| 2015/0207524 A1 * | 7/2015 | Vojcic | ............... | H04L 1/0041 714/759 |
| 2016/0043743 A1 * | 2/2016 | Vojcic | ............... | H04L 1/005 714/755 |
| 2016/0043744 A1 * | 2/2016 | Vojcic | ............... | H04L 1/005 714/755 |
| 2016/0043745 A1 * | 2/2016 | Vojcic | ............... | H04L 1/005 714/755 |
| 2019/0260505 A1 * | 8/2019 | Milbar | ............... | H04L 1/0041 |

OTHER PUBLICATIONS

"International Application Serial No. PCT/US2019/031046, Written Opinion dated Jul. 10, 2019", 7 pgs.

Brain, Chen, et al., "Complementary Punctured-Pair Convolutional Codes for Digital Audio Broadcasting", IEEE Transactions on Communications, IEEE Service Center, Piscataway, NJ. USA, vol. 48, No. 11, (Nov. 1, 2000), 1829-1830.

* cited by examiner

FIG. 14

TRANSFER FRAME CHARACTERISTICS—SERVICE MODE MP1X WITH 4-QAM

| LOGICAL CHANNEL | TRANSFER FRAME SIZE (BITS) | TRANSFER FRAME RATE (Hz) | INTERLEAVER MATRIX |
|---|---|---|---|
| MAIN P4 | 73728 | $R_f$ | PXM |
| BACKUP P4 | 9216 | $R_p$ | PXB |

FIG. 15

FREQUENCY PARTITION MAPPING FOR MP1X WITH 16-QAM

| | | | | | | | | |
|---|---|---|---|---|---|---|---|---|
| LOWER SIDEBAND INTERLEAVER FREQUENCY PARTITION MAPPING | | | | | | | | |
| FROM | 0 | 1 | 2 | 3 | 4 | 5 | 6 | 7 |
| TO MSB | 9 | | 10 | | 11 | | 12 | 13 |
| FROM | | | | | | | | |
| TO LSB | | 1 | 2 | 3 | | | | |
| LSB | | | | | 10 | 11 | 12 | 13 |
| UPPER SIDEBAND INTERLEAVER FREQUENCY PARTITION MAPPING | | | | | | | | |
| FROM | 8 | | 10 | 11 | | 19 | 20 | 21 |
| TO MSB | 14 | 15 | 16 | 17 | 18 | | | |
| FROM | 12 | 13 | 14 | 15 | | | | |
| TO LSB | 14 | 15 | 16 | 17 | 18 | 19 | 20 | 21 |

(continued)

| | | | | | | |
|---|---|---|---|---|---|---|
| 22 | 23 | 24 | 25 | 26 | 27 |
| 22 | 23 | 24 | 25 | 26 | 27 |

FIG. 16 — MP1X WITH 16-QAM PUNCTURE PATTERN

| GEN | 0 | 1 | 2 | 3 | 4 | 5 | 6 | 7 | 8 | 9 | 10 | 11 |
|---|---|---|---|---|---|---|---|---|---|---|---|---|
| G1 | B-14 | M-8 | B-13 | M-10 | B-8 | B-1 | B-15 | M-9 | B-12 | M-11 | B-9 | B-0 |
| G2 | B-10 | B-3 | M-7 | B-4 | M-14 | M-13 | B-11 | B-2 | M-6 | B-5 | M-15 | M-12 |
| G3 | M-4 | B-7 | N/A | N/A | M-3 | M-1 | M-5 | B-6 | N/A | N/A | M-2 | M-0 |

FIG. 17 — FREQUENCY PARTITION MAPPING FOR MP1X WITH 64-QAM

LOWER SIDEBAND INTERLEAVER FREQUENCY PARTITION MAPPING

| FROM | 0 | 1 | 2 | 3 | 4 | 5 | 6 | 7 | 8 | 9 | 10 | 11 |
| TO MSB | 12 | 13 | 14 | 15 | 16 | 17 | 18 | 19 | 20 | 21 | 22 | 23 | 24 | 25 | 26 | 27 |
| FROM | 0 | 2 | 3 | 4 | 5 | 6 | 7 | 8 | 9 | 10 | 11 | 12 | 13 |
| TO XSB | 14 | 16 | 18 | 5 | 6 | 4 | 5 | 8 | 4 | 11 | 5 | 6 | 7 |
| FROM | 0 | 2 | 3 | 4 | 5 | 6 | 7 | 8 | 9 | 10 | 11 | 12 |
| TO LSB | 16 | 18 | 17 | 19 | 10 | 11 | 12 | 13 |

UPPER SIDEBAND INTERLEAVER FREQUENCY PARTITION MAPPING

| FROM | 12 | 13 | 14 | 15 | 16 | 17 | 18 | 19 | 20 | 21 | 22 | 23 |
| TO MSB | 14 | 15 | 16 | 17 | 18 | 19 | 20 | 21 | 22 | 23 | 24 | 25 | 26 | 27 |
| FROM | 16 | 17 | 18 | 19 | 0 | 1 | 2 | 3 |
| TO XSB | 14 | 15 | 16 | 17 | 19 | 20 | 21 | 22 | 23 | 24 | 25 | 26 |
| FROM | 20 | 21 | 22 | 23 | 24 | 25 | 26 | 27 |
| TO LSB | 14 | 15 | 16 | 17 | 18 | 19 | 20 | 21 | 22 | 23 | 24 | 25 | 26 | 27 |

MP1X WITH 64-QAM PUNCTURE PATTERN

| GEN | \multicolumn{16}{c}{INFORMATION BIT INDEX} |
|---|---|---|---|---|---|---|---|---|---|---|---|---|---|---|---|---|

| GEN | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| G1 | M-12 | M-7 | M-13 | M-9 | M-16 | M-5 | M-18 | M-8 | M-19 | M-6 | M-17 | M-11 | M-15 | M-4 | M-14 | M-10 |
| G2 | M-3 | B-12 | B-9 | B-13 | M-2 | B-16 | B-8 | B-18 | M-0 | B-19 | B-11 | B-17 | M-1 | B-15 | B-10 | B-14 |
| G3 | B-0 | B-23 | B-2 | M-23 | B-7 | B-22 | B-3 | M-22 | B-5 | B-21 | B-6 | B-21 | B-1 | B-20 | B-4 | B-20 |

FIG. 18

FREQUENCY PARTITION MAPPING FOR MP3X WITH 4-QAM

LOWER SIDEBAND INTERLEAVER FREQUENCY PARTITION MAPPING

| FROM | 0 | 1 | ... | 11 | 12 | 13 |
|---|---|---|---|---|---|---|
| TO | 0 | 1 | ... | 11 | 12 | 13 |

UPPER SIDEBAND INTERLEAVER FREQUENCY PARTITION MAPPING

| FROM | 2 | 3 | ... | 15 | 16 | 17 | 18 | 19 | 20 | 21 | 22 | 23 | 24 | 25 | 26 | 27 |
|---|---|---|---|---|---|---|---|---|---|---|---|---|---|---|---|---|
| TO | 14 | 15 | ... | 16 | 17 | 18 | 19 | 20 | 21 | 22 | 23 | 24 | 25 | 26 | 27 | |

FIG. 19

MP3X WITH 4-QAM PUNCTURE PATTERN

| GEN | 0 | 1 | 2 | 3 | 4 | 5 |
|---|---|---|---|---|---|---|
| G1 | B-3 | M-2 | M-3 | B-1 | B-2 | B-0 |
| G2 | B-2 | B-0 | M-1 | N/A | M-3 | M-6 |
| G3 | M-0 | B-1 | N/A | N/A | M-1 | M-0 |

FIG. 20

TRANSFER FRAME CHARACTERISTICS—SERVICE MODE MP3X WITH 4-QAM

| LOGICAL CHANNEL | TRANSFER FRAME SIZE (BITS) | TRANSFER FRAME RATE (Hz) | INTERLEAVER MATRIX |
|---|---|---|---|
| MAIN P4 | 36864 | $R_f$ | PXM |
| BACKUP P4 | 4608 | $R_p$ | PXB |

FIG. 21

FREQUENCY PARTITION MAPPING FOR MP3X WITH 16-QAM

| | | | | | | | | | | | | | | |
|---|---|---|---|---|---|---|---|---|---|---|---|---|---|---|
| LOWER SIDEBAND INTERLEAVER FREQUENCY PARTITION MAPPING | | | | | | | | | | | | | | |
| FROM | 0 | 1 | 2 | 3 | 4 | 5 | 6 | 7 | 8 | 9 | 10 | 11 | 12 | 13 |
| TO MSB | 0 | 1 | 2 | 3 | 4 | 5 | 6 | 7 | 8 | 9 | 10 | 11 | 12 | 13 |
| FROM | | | | | | | | | | | | | | |
| TO LSB | 0 | 1 | 2 | 3 | 4 | 5 | 6 | 7 | 8 | 9 | 10 | 11 | 12 | 13 |
| UPPER SIDEBAND INTERLEAVER FREQUENCY PARTITION MAPPING | | | | | | | | | | | | | | |
| FROM | 4 | 5 | | | | | | | | | | | | |
| TO MSB | 14 | 15 | 16 | 17 | 18 | 19 | 20 | 21 | 22 | 23 | 24 | 25 | 26 | 27 |
| FROM | 6 | 7 | | | | | | | | | | | | |
| TO | 14 | 15 | 16 | 17 | 18 | 19 | 20 | 21 | 22 | 23 | 24 | 25 | 26 | 27 |

FIG. 22

MP3X WITH 16-QAM PUNCTURE PATTERN

| GEN | 0 | 1 | 2 | 3 | 4 | 5 |
|---|---|---|---|---|---|---|
| G1 | B-7 | M-4 | B-6 | M-5 | B-4 | B-0 |
| G2 | B-5 | B-1 | M-3 | B-2 | M-7 | M-6 |
| G3 | M-2 | B-3 | N/A | N/A | M-1 | M-0 |

FIG. 23

FREQUENCY PARTITION MAPPING FOR MP3X_64-QAM

LOWER SIDEBAND INTERLEAVER FREQUENCY PARTITION MAPPING

| | | | | | | |
|---|---|---|---|---|---|---|
| FROM | 0 | 1 | 2 | 3 | 4 | 5 |
| TO MSB | 14 | 15 | 16 | 17 | 18 | 13 |
| FROM | 0 | 8 | 9 | | | |
| TO XSB | 14 | 15 | 16 | | | |
| FROM | 0 | 10 | 11 | | | |
| TO LSB | 14 | 15 | 16 | | | |

UPPER SIDEBAND INTERLEAVER FREQUENCY PARTITION MAPPING

| | | | | | | |
|---|---|---|---|---|---|---|
| FROM | 6 | 7 | | | | |
| TO MSB | 14 | 15 | 16 | 17 | 18 | 19 |
| FROM | 8 | 9 | | | | |
| TO XSB | 14 | 15 | 16 | | | |
| FROM | 10 | 11 | | | | |
| TO LSB | 14 | 15 | 16 | | | |

MP3X WITH 64-QAM PUNCTURE PATTERN

| GEN | INFORMATION BIT INDEX | | | | | | | |
|---|---|---|---|---|---|---|---|---|
| | 0 | 1 | 2 | 3 | 4 | 5 | 6 | 7 |
| G1 | M-6 | M-2 | M-7 | M-5 | M-9 | M-3 | M-8 | M-4 |
| G2 | M-1 | B-6 | B-5 | B-7 | M-0 | B-9 | B-4 | B-8 |
| G3 | B-1 | B-10 | B-0 | M-10 | B-2 | B-11 | B-3 | M-11 |

FIG. 26

FREQUENCY PARTITION MAPPING FOR DSB1 WITH 4-QAM

LOWER SIDEBAND INTERLEAVER FREQUENCY PARTITION MAPPING

| | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| FROM | 0 | 1 | 2 | 3 | 4 | 5 | 6 | 7 | 8 | 9 | 10 | 11 | 12 | 13 |
| TO | 0 | 1 | 2 | 3 | 4 | 5 | 6 | 7 | 8 | 9 | 10 | 11 | 12 | 13 |

UPPER SIDEBAND INTERLEAVER FREQUENCY PARTITION MAPPING

| | | | | | | | | | | | | | | |
|---|---|---|---|---|---|---|---|---|---|---|---|---|---|---|
| FROM | 14 | 15 | 16 | 17 | 18 | 19 | 20 | 21 | 22 | 23 | 24 | 25 | 26 | 27 |
| TO | 14 | 15 | 16 | 17 | 18 | 19 | 20 | 21 | 22 | 23 | 24 | 25 | 26 | 27 |

FIG. 27

DSB1 PUNCTURE PATTERN WITH 4-QAM

| GEN | INFORMATION BIT INDEX | | | | | | | | | | | | | | | | | | | |
|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 |
| G1 | B-20 | B-25 | B-22 | B-2 | N/A | B-19 | B-26 | B-9 | B-1 | N/A | B-21 | B-24 | B-23 | B-3 | N/A | B-18 | B-27 | B-8 | B-0 | N/A |
| G2 | M-11 | M-2 | B-13 | M-14 | M-20 | M-13 | M-1 | M-11 | M-16 | M-22 | M-10 | M-3 | B-12 | M-15 | M-21 | B-12 | M-0 | B-10 | M-17 | M-23 |
| G3 | B-16 | M-25 | M-9 | B-7 | M-5 | B-14 | M-26 | M-19 | B-5 | M-7 | M-17 | M-24 | M-8 | B-6 | M-4 | B-15 | M-27 | M-18 | B-4 | M-6 |

| TRANSFER FRAME CHARACTERISTICS—SERVICE MODE DSB1 WITH 4-QAM ||||
|---|---|---|---|
| LOGICAL CHANNEL | TRANSFER FRAME SIZE (BITS) | TRANSFER FRAME RATE (Hz) | INTERLEAVER MATRIX |
| MAIN P1 | 254464 | $R_f$ | PB-M |
| BACKUP P1 | 31808 | $R_p$ | PB-BU |
| PIDS (I) | 224 | $R_b$ | PB-I |
| PIDS (Q) | 224 | $R_b$ | PB-Q |

FREQUENCY PARTITION MAPPING FOR DSB1 WITH 16QAM

| LOWER SIDEBAND INTERLEAVER FREQUENCY PARTITION MAPPING | | | | | | | | | | | | | | |
|---|---|---|---|---|---|---|---|---|---|---|---|---|---|---|
| FROM | 14 | 15 | 16 | 17 | 18 | 19 | 20 | 21 | 22 | 23 | 24 | 25 | 26 | 27 |
| TO MSB | 0 | 1 | 2 | 3 | 4 | 5 | 6 | 7 | 8 | 9 | 10 | 11 | 12 | 13 |
| FROM | 0 | 1 | 2 | 3 | 4 | 5 | 6 | 7 | 8 | 9 | 10 | 11 | 12 | 13 |
| TO LSB | 0 | 1 | 2 | 3 | 4 | 5 | 6 | 7 | 8 | 9 | 10 | 11 | 12 | 13 |
| UPPER SIDEBAND INTERLEAVER FREQUENCY PARTITION MAPPING | | | | | | | | | | | | | | |
| FROM | 28 | 29 | 30 | 31 | 32 | 33 | 34 | 35 | 36 | 37 | 38 | 39 | 40 | 41 |
| TO MSB | 14 | 15 | 16 | 17 | 18 | 19 | 20 | 21 | 22 | 23 | 24 | 25 | 26 | 27 |
| FROM | 42 | 43 | 44 | 45 | 46 | 47 | 48 | 49 | 50 | 51 | 52 | 53 | 54 | 55 |
| TO LSB | 14 | 15 | 16 | 17 | 18 | 19 | 20 | 21 | 22 | 23 | 24 | 25 | 26 | 27 |

FIG. 32 — DBS1 WITH 16QAM PUNCTURE PATTERN

INFORMATION BIT INDEX

| GEN | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| G1 | B-40 | B-49 | B-45 | B-4 | N/A | B-39 | B-53 | B-18 | B-0 | N/A | B-42 | B-50 | B-46 | B-7 | N/A | B-37 | B-52 | B-17 | B-2 | N/A |
| G2 | M-22 | M-4 | B-26 | B-28 | M-40 | B-26 | M-0 | B-22 | M-32 | M-45 | M-21 | M-7 | B-25 | M-29 | M-42 | M-25 | M-2 | B-21 | M-34 | M-46 |
| G3 | B-32 | M-49 | M-18 | B-14 | M-8 | B-28 | M-53 | M-39 | B-8 | M-14 | B-34 | M-50 | M-17 | B-12 | M-10 | B-29 | M-52 | M-37 | B-10 | M-12 |

|  | 20 | 21 | 22 | 23 | 24 | 25 | 26 | 27 | 28 | 29 | 30 | 31 | 32 | 33 | 34 | 35 | 36 | 37 | 38 | 39 |
|---|---|---|---|---|---|---|---|---|---|---|---|---|---|---|---|---|---|---|---|---|
| G1 | B-41 | B-51 | B-44 | B-5 | N/A | B-36 | B-54 | B-19 | B-1 | N/A | B-43 | B-48 | B-47 | B-6 | N/A | B-38 | B-55 | B-16 | B-3 | N/A |
| G2 | M-23 | M-5 | B-27 | M-31 | M-41 | M-27 | M-1 | B-23 | M-33 | M-44 | M-20 | M-6 | B-24 | M-30 | M-43 | M-24 | M-3 | B-20 | M-35 | M-47 |
| G3 | B-33 | M-51 | M-19 | B-13 | M-11 | B-31 | M-54 | M-36 | B-11 | M-13 | B-35 | M-48 | M-16 | B-15 | M-9 | B-30 | M-55 | M-38 | B-4 | M-15 |

FIG. 33 — FREQUENCY PARTITION MAPPING FOR DSB1 WITH 64-QAM

LOWER SIDEBAND INTERLEAVER FREQUENCY PARTITION MAPPING

| FROM | 28 | 29 | 30 | 31 | 32 | 33 | 34 | 35 | 36 | 37 | 38 | 39 | 40 | 41 |
|---|---|---|---|---|---|---|---|---|---|---|---|---|---|---|
| TO MSB | 0 | 1 | 2 | 3 | 4 | 5 | 6 | 7 | 8 | 9 | 10 | 11 | 12 | 13 |
| FROM | 14 | 15 | 16 | 17 | 18 | 19 | 20 | 21 | 22 | 23 | 24 | 25 | 26 | 27 |
| TO LSB | 0 | 1 | 2 | 3 | 4 | 5 | 6 | 7 | 8 | 9 | 10 | 11 | 12 | 13 |

UPPER SIDEBAND INTERLEAVER FREQUENCY PARTITION MAPPING

| FROM | 42 | 43 | 44 | 45 | 46 | 47 | 48 | 49 | 50 | 51 | 52 | 53 | 54 | 55 |
|---|---|---|---|---|---|---|---|---|---|---|---|---|---|---|
| TO MSB | 14 | 15 | 16 | 17 | 18 | 19 | 20 | 21 | 22 | 23 | 24 | 25 | 26 | 27 |
| FROM | 56 | 57 | 58 | 59 | 60 | 61 | 62 | 63 | 64 | 65 | 66 | 67 | 68 | 69 |
| TO XSB | 14 | 15 | 16 | 17 | 18 | 19 | 20 | 21 | 22 | 23 | 24 | 25 | 26 | 27 |
| FROM | 70 | 71 | 72 | 73 | 74 | 75 | 76 | 77 | 78 | 79 | 80 | 81 | 82 | 83 |
| TO LSB | 14 | 15 | 16 | 17 | 18 | 19 | 20 | 21 | 22 | 23 | 24 | 25 | 26 | 27 |

DSB1 WITH 64-QAM PUNCTURE PATTERN

FIG. 34

INFORMATION BIT INDEX

| GEN | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| G1 | M-42 | M-22 | M-43 | M-34 | M-46 | M-18 | M-58 | M-33 | M-67 | M-27 | M-48 | M-40 | M-59 | M-17 |
| G2 | M-2 | B-42 | B-34 | B-43 | M-13 | B-46 | B-33 | B-58 | M-4 | B-67 | B-40 | B-48 | M-9 | B-59 |
| G3 | B-16 | B-83 | B-22 | M-83 | B-6 | B-73 | B-19 | M-73 | B-1 | B-70 | B-14 | M-70 | B-17 | B-80 |
|  | 14 | 15 | 16 | 17 | 18 | 19 | 20 | 21 | 22 | 23 | 24 | 25 | 26 | 27 |
| G1 | M-61 | M-32 | M-65 | M-15 | M-68 | M-29 | M-49 | M-25 | M-51 | M-39 | M-55 | M-19 | M-60 | M-36 |
| G2 | B-32 | B-61 | M-12 | B-13 | B-29 | B-65 | M-11 | B-49 | B-39 | B-51 | M-3 | B-55 | B-36 | B-60 |
| G3 | B-9 | M-80 | B-25 | B-65 | B-12 | B-81 | B-4 | B-77 | B-15 | M-77 | B-8 | B-72 | B-18 | M-72 |
|  | 28 | 29 | 30 | 31 | 32 | 33 | 34 | 35 | 36 | 37 | 38 | 39 | 40 | 41 |
| G1 | M-62 | M-21 | M-63 | M-31 | M-64 | M-16 | M-66 | M-30 | M-57 | M-14 | M-56 | M-28 | M-69 | M-26 |
| G2 | M-8 | B-62 | B-31 | B-63 | M-7 | B-64 | B-30 | B-66 | M-6 | B-57 | B-28 | B-56 | M-5 | B-69 |
| G3 | B-20 | B-74 | B-21 | M-74 | B-23 | B-75 | B-24 | B-75 | B-26 | B-79 | B-27 | M-79 | B-5 | B-71 |
|  | 42 | 43 | 44 | 45 | 46 | 47 | 48 | 49 | 50 | 51 | 52 | 53 | 54 | 55 |
| G1 | M-50 | M-41 | M-52 | M-24 | M-53 | M-38 | M-54 | M-20 | M-47 | M-37 | M-45 | M-23 | M-44 | M-35 |
| G2 | B-41 | B-50 | M-0 | B-52 | B-38 | B-53 | M-10 | B-54 | B-37 | B-47 | M-1 | B-45 | B-44 | B-44 |
| G3 | B-13 | M-71 | B-11 | B-78 | B-10 | M-78 | B-0 | B-82 | B-3 | M-82 | B-2 | B-76 | B-7 | M-76 |

FREQUENCY PARTITION MAPPING FOR SSB1 WITH 4-QAM

SINGLE SIDEBAND INTERLEAVER FREQUENCY PARTITION MAPPING

| FROM | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| TO | 0 | 1 | 2 | 3 | 4 | 5 | 6 | 7 | 8 | 9 | 10 | 11 | 12 | 13 |

FIG. 35

SSB1 WITH 4-QAM PUNCTURE PATTERN

| GEN | INFORMATION BIT INDEX | | | | | | | | | |
|---|---|---|---|---|---|---|---|---|---|---|
| | 0 | 1 | 2 | 3 | 4 | 5 | 6 | 7 | 8 | 9 |
| G1 | B-10 | B-12 | B-11 | B-1 | N/A | B-9 | B-13 | B-4 | B-0 | N/A |
| G2 | M-5 | M-1 | B-6 | M-7 | M-10 | M-6 | M-0 | B-5 | M-8 | M-11 |
| G3 | B-8 | M-12 | M-4 | B-3 | M-2 | B-7 | M-13 | M-9 | B-2 | M-3 |

*FIG. 36*

TRANSFER FRAME CHARACTERISTICS—SERVICE MODE SSB1 WITH 4-QAM

| LOGICAL CHANNEL | TRANSFER FRAME SIZE (BITS) | TRANSFER FRAME RATE (Hz) | INTERLEAVER MATRIX |
|---|---|---|---|
| MAIN P1 | 127232 | $R_f$ | PB-M |
| BACKUP P1 | 15904 | $R_p$ | PB-BU |
| PIDS (I) | 112 | $R_b$ | PB-I |
| PIDS (Q) | 112 | $R_b$ | PB-Q |

FREQUENCY PARTITION MAPPING FOR SSB1 WITH 16-QAM

| | 7 | 8 | 9 | 10 | 11 | 12 | 13 | 14 | 15 | 16 | 17 | 18 | 19 | 20 |
|---|---|---|---|---|---|---|---|---|---|---|---|---|---|---|
| | SINGLE SIDEBAND INTERLEAVER FREQUENCY PARTITION MAPPING | | | | | | | | | | | | | |
| FROM | 0 | 1 | 2 | 3 | 4 | 5 | 6 | 7 | 8 | 9 | 10 | 11 | 12 | 13 |
| TO MSB | 0 | 1 | 2 | 3 | 4 | 5 | 6 | 21 | 22 | 23 | 24 | 25 | 26 | 27 |
| FROM | 0 | 1 | 2 | 3 | 4 | 5 | 6 | 7 | 8 | 9 | 10 | 11 | 12 | 13 |
| TO LSB | 0 | 1 | 2 | 3 | 4 | 5 | 6 | 7 | 8 | 9 | 10 | 11 | 12 | 13 |

FIG. 39

SSB1 WITH 16-QAM PUNCTURE PATTERN

| GEN | \multicolumn{20}{c}{INFORMATION BIT INDEX} |
|---|---|

| GEN | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| G1 | B-20 | B-25 | B-22 | B-2 | N/A | B-19 | B-26 | B-9 | B-1 | N/A | B-21 | B-24 | B-23 | B-3 | N/A | B-18 | B-27 | B-8 | B-0 | N/A |
| G2 | M-11 | M-2 | B-13 | M-14 | M-20 | M-13 | M-1 | B-11 | M-16 | M-22 | M-10 | M-3 | B-12 | M-15 | M-21 | M-12 | M-0 | B-10 | M-17 | M-23 |
| G3 | B-16 | M-25 | M-9 | B-7 | M-5 | B-14 | M-26 | M-19 | B-5 | M-7 | B-17 | M-24 | M-8 | B-6 | M-4 | B-15 | M-27 | M-18 | B-4 | M-6 |

FIG. 40

FREQUENCY PARTITION MAPPING FOR SSB1 WITH 64-QAM

LOWER SIDEBAND INTERLEAVER FREQUENCY PARTITION MAPPING

| FROM | 28 | 29 | 30 | 31 | 32 | 33 | 34 | 35 | 36 | 37 | 38 | 39 | 40 | 41 |
|------|----|----|----|----|----|----|----|----|----|----|----|----|----|----|
| TO MSB | 0 | 1 | 2 | 3 | 4 | 5 | 6 | 7 | 8 | 9 | 10 | 11 | 12 | 13 |
| FROM | 14 | 15 | 16 | 17 | 18 | 19 | 20 | 21 | 22 | 23 | 24 | 25 | 26 | 27 |
| TO XSB | 0 | 1 | 2 | 3 | 4 | 5 | 6 | 7 | 8 | 9 | 10 | 11 | 12 | 13 |
| FROM | 0 | 1 | 2 | 3 | 4 | 5 | 6 | 7 | 8 | 9 | 10 | 11 | 12 | 13 |
| TO LSB | 0 | 1 | 2 | 3 | 4 | 5 | 6 | 7 | 8 | 9 | 10 | 11 | 12 | 13 |

FIG. 41

SSB1 WITH 64-QAM PUNCTURE PATTERN

| GEN | 0 | 1 | 2 | 3 | 4 | 5 | 6 | 7 | 8 | 9 | 10 | 11 | 12 | 13 |
|-----|---|---|---|---|---|---|---|---|---|---|----|----|----|----|
| G1 | M-21 | M-11 | M-22 | M-17 | M-24 | M-10 | M-30 | M-16 | M-34 | M-13 | M-25 | M-20 | M-31 | M-8 |
| G2 | M-2 | B-21 | B-17 | B-22 | M-4 | B-24 | B-33 | B-30 | M-1 | B-34 | B-20 | B-25 | M-6 | B-31 |
| G3 | B-2 | B-37 | B-7 | M-37 | B-4 | B-41 | B-16 | M-41 | B-13 | B-40 | B-6 | M-40 | B-3 | B-38 |
|     | 14 | 15 | 16 | 17 | 18 | 19 | 20 | 21 | 22 | 23 | 24 | 25 | 26 | 27 |
| G1 | M-32 | M-15 | M-33 | M-7 | M-29 | M-14 | M-26 | M-12 | M-27 | M-19 | M-28 | M-9 | M-23 | M-18 |
| G2 | B-15 | B-32 | M-0 | B-33 | B-14 | B-29 | M-5 | B-26 | B-19 | B-27 | M-3 | B-28 | B-18 | B-23 |
| G3 | B-9 | M-38 | B-11 | B-36 | B-12 | M-36 | B-1 | B-35 | B-5 | M-35 | B-10 | B-39 | B-0 | M-39 |

INFORMATION BIT INDEX

FREQUENCY PARTITION MAPPING FOR MS5 WITH 4-QAM

| | | | | | | LOWER SIDEBAND INTERLEAVER FREQUENCY PARTITION MAPPING | | | | | | | | |
|---|---|---|---|---|---|---|---|---|---|---|---|---|---|---|
| FROM | 0 | 1 | 2 | 3 | 4 | 5 | 6 | 7 | 8 | 9 | 10 | 11 | 12 | 13 |
| TO | 42 | 43 | 44 | 45 | 46 | 47 | 48 | 49 | 50 | 51 | 52 | 53 | 54 | 55 |

| | | | | | | UPPER SIDEBAND INTERLEAVER FREQUENCY PARTITION MAPPING | | | | | | | | |
|---|---|---|---|---|---|---|---|---|---|---|---|---|---|---|
| FROM | 14 | 15 | 16 | 17 | 18 | 19 | 20 | 21 | 22 | 23 | 24 | 25 | 26 | 27 |
| TO | 28 | 29 | 30 | 31 | 32 | 33 | 34 | 35 | 36 | 37 | 38 | 39 | 40 | 41 |

FIG. 42

MS5 WITH 4-QAM PUNCTURE PATTERN

| GEN | INFORMATION BIT INDEX | | | | | | | | | | | | | | | | | | | |
|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 |
| G1 | B-20 | B-25 | B-22 | B-2 | N/A | B-19 | B-26 | B-9 | B-1 | N/A | B-21 | B-24 | B-23 | B-3 | N/A | B-18 | B-27 | B-8 | B-0 | N/A |
| G2 | M-11 | M-2 | B-13 | M-14 | M-20 | M-13 | M-1 | B-11 | M-16 | M-22 | M-10 | M-3 | B-12 | M-15 | M-21 | M-12 | M-0 | B-10 | M-17 | M-23 |
| G3 | B-16 | M-25 | M-9 | B-7 | M-5 | B-14 | M-26 | M-19 | B-5 | M-7 | B-17 | M-24 | M-8 | B-6 | M-4 | B-15 | M-27 | M-18 | B-4 | M-6 |

FIG. 43

GEN_PCi = [long binary matrix]

LUMB SERVICE MODES FOR FM HD RADIO BROADCASTS

CROSS-REFERENCE TO RELATED APPLICATION

This application is a Continuation-in-Part of U.S. patent application Ser. No. 15/973,721, filed on May 8, 2018, the contents of which are incorporated herein in their entirety.

TECHNICAL FIELD

The technology described in this document relates to devices and methods for transmitting and processing frequency modulation (FM) in-band on-channel (IBOC) radio signals, and more particularly to devices and methods for defining service modes for FM IBOC radio signals.

BACKGROUND

The Xperi HD Radio™ system is designed to permit a smooth evolution from current analog amplitude modulation (AM) and frequency modulation (FM) radio systems to an in-band on-channel (IBOC) system. An IBOC system can deliver digital audio and data services to mobile, portable, and fixed receivers from terrestrial transmitters in the existing medium frequency (MF) and very high frequency (VHF) radio bands.

IBOC signals can be transmitted in a hybrid format that includes an analog modulated carrier in combination with a plurality of digitally modulated subcarriers, or in an all-digital format in which an analog modulated carrier is not used. Using the hybrid format, broadcasters may continue to transmit analog AM and FM simultaneously with higher-quality and more robust digital signals, allowing themselves and their listeners to convert from analog to digital radio while maintaining their current frequency allocations. IBOC hybrid and all-digital waveforms are described in U.S. Pat. No. 7,933,368, which is incorporated by reference herein in its entirety.

Data can be processed in an IBOC system using a multi-layer logical protocol stack. A service mode of an IBOC radio signal can determine a grade of service of data provided by the IBOC signaling. It is desirable to improve the grade of service of the IBOC signaling by improving robustness and capacity.

SUMMARY

The technology presented in this document relates to service modes to improve the capacity and robustness of FM IBOC radio broadcast signals.

A radio transmitter example includes transmitting circuitry and processing circuitry. The transmitting circuitry broadcasts a frequency modulation (FM) in-band on-channel (IBOC) radio signal, wherein the FM IBOC radio signal includes multiple subcarriers arranged into multiple frequency partitions. The processing circuitry is configured to receive input bits for transmitting; encode the input bits using forward error correction (FEC) encoding; distribute encoded input bits between a main encoded component and a backup encoded component, wherein encoded bits of the backup encoded component are delayed for a specified duration relative to encoded bits of the main encoded component; allocate the encoded input bits of the main and backup encoded components into frequency diverse sidebands of the FM IBOC radio signal; and modulate the encoded input bits for transmitting using the frequency diverse sidebands of the FM IBOC radio signal, wherein the modulation is a type of quadrature amplitude modulation (QAM).

This section is intended to provide a brief overview of subject matter of the present patent application. It is not intended to provide an exclusive or exhaustive explanation of the invention. The detailed description is included to provide further information about the present patent application such as a discussion of the dependent claims and the interrelation of the dependent and independent claims in addition to the statements made in this section.

BRIEF DESCRIPTION OF THE DRAWINGS

FIG. 14 is a Table of transfer frame characteristics for the interleaver for the primary extended (PX) sideband for the MP1X service mode (4-QAM).

FIG. 15 is a table showing an example of frequency-partition mapping for the MP1X service mode with 16-QAM.

FIG. 16 is a table showing the FEC puncture pattern for the MP1X service mode with 16-QAM.

FIG. 17 is a table showing an example of frequency-partition mapping for the MP1X service mode with 64-QAM.

FIG. 18 is a Table showing the FEC puncture pattern for the MP1X service mode with 64-QAM.

FIG. 19 is a Table showing an example of frequency-partition mapping for the MP3X service mode with 4-QAM.

FIG. 20 is a Table showing the FEC puncture pattern for the MP3X service mode with 4-QAM.

FIG. 21 is a Table of transfer frame characteristics for the interleaver for the PX sideband for the MP3X service mode (4-QAM).

FIG. 22 is a table showing an example of frequency-partition mapping for the MP3X service mode with 16-QAM.

FIG. 23 is a table showing the FEC puncture pattern for the MP3X service mode with 16-QAM.

FIG. 24 is a Table showing an example of frequency-partition mapping for the MP3X service mode with 64-QAM.

FIG. 25 is a Table showing the FEC puncture pattern for the MP3X service mode with 64-QAM.

FIG. 26 is a Table showing an example of frequency-partition mapping for the DSB1 service mode with 4-QAM.

FIG. 27 is a Table showing the FEC puncture pattern for the DSB1 service mode with 4-QAM.

FIG. 32 is a Table showing the FEC puncture pattern for the DSB1 service mode with 16-QAM.

FIG. 33 is a Table showing an example of frequency-partition mapping for the DSB1 service mode with 64-QAM.

FIG. 34 is a Table showing the FEC puncture pattern for the DSB1 service mode with 64-QAM.

FIG. 35 is a Table showing an example of frequency-partition mapping for the SSB1 service mode with 4-QAM.

FIG. 36 is a Table showing the FEC puncture pattern for the SSB1 service mode with 4-QAM.

FIG. 37 is a Table of transfer frame characteristics for the interleaver for the PB sideband for the SSB1 service mode (4-QAM).

FIG. 38 is a Table showing an example of frequency-partition mapping for the SSB1 service mode with 16-QAM.

FIG. 39 is a Table showing the FEC puncture pattern for the SSB1 service mode with 16-QAM.

FIG. 40 is a Table showing an example of frequency-partition mapping for the SSB1 service mode with 64-QAM.

FIG. 41 is a Table showing the FEC puncture pattern for the SSB1 service mode with 64-QAM.

FIG. 42 is a Table showing an example of frequency-partition mapping for the MS5 secondary service mode with 4-QAM.

FIG. 43 is a Table showing the FEC puncture pattern for the MS5 secondary service mode with 4-QAM.

DESCRIPTION

The following description describes various embodiments of methods and apparatus that provide improved service modes for FM IBOC radio signals. Improvements include enhanced robustness through time and frequency diversity of data transmitted using the radio signals, and increased capacity through quadrature amplitude modulation.

IBOC Signaling

Digital data is carried through FM IBOC processing circuitry over one or more logical channels, which are characterized by a throughput and robustness that is defined by the service mode. The FM IBOC digital signal is modulated using orthogonal frequency division multiplexing (OFDM). OFDM is a parallel modulation scheme in which the data stream modulates a large number of orthogonal subcarriers, which are transmitted simultaneously. OFDM is inherently flexible, readily allowing the mapping of logical channels to different groups of subcarriers.

Figure 1:
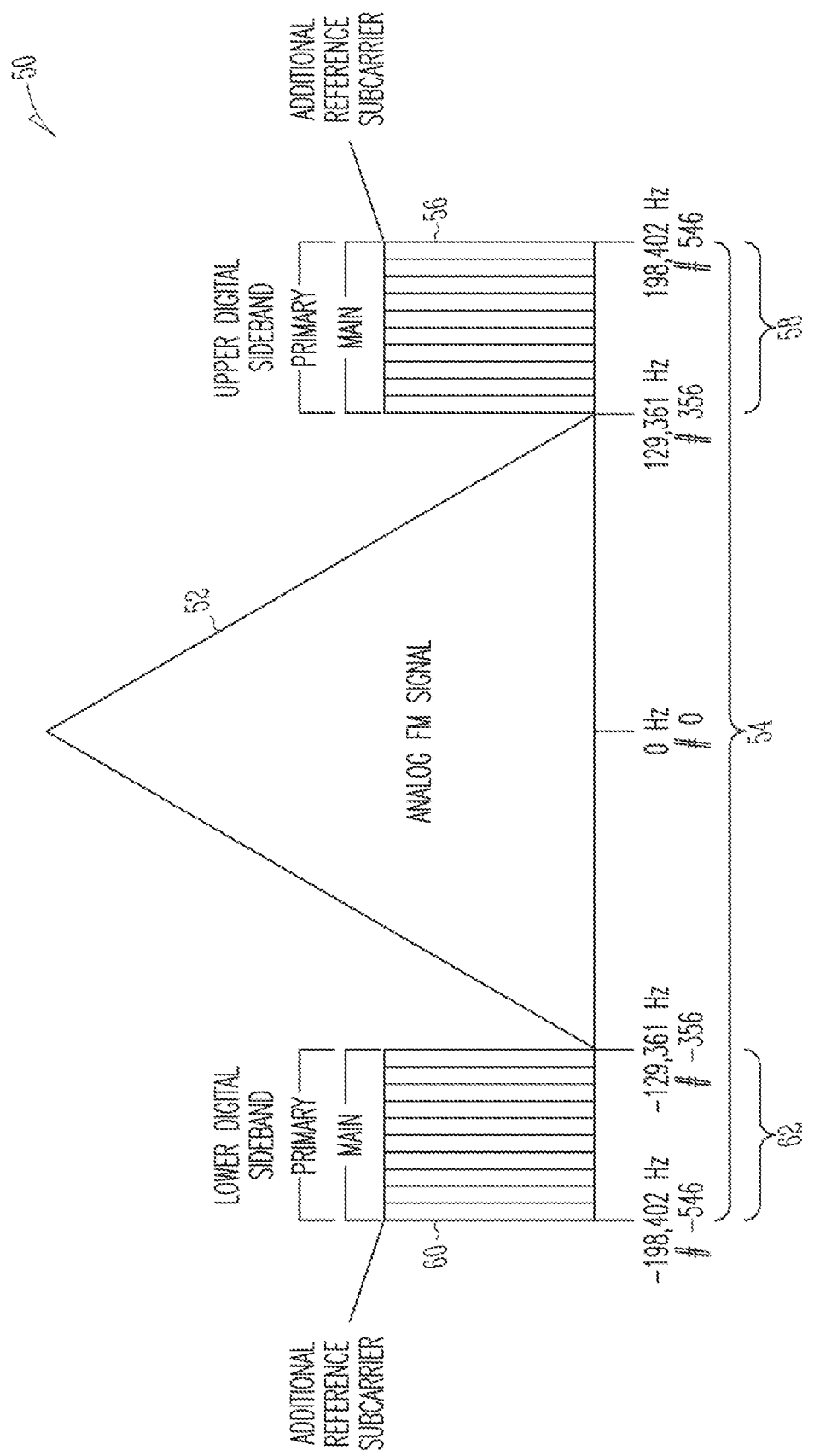
FIG. 1 is a schematic representation of the spectrum of a hybrid frequency modulation (FM) in-band on-channel (IBOC) waveform.

FIG. 1 is a schematic representation of the spectrum of the hybrid FM IBOC waveform 50 to which the methods described herein can be applied. The waveform includes an analog modulated signal 52 located in the center of a broadcast channel 54, a first set of multiple evenly spaced OFDM subcarriers 56 in an upper sideband 58, and a second set of multiple evenly spaced OFDM subcarriers 60 in a lower sideband 62. The digitally modulated subcarriers are broadcast at a lower power level than the analog modulated carrier to comply with required channel signal masks. The digitally modulated subcarriers are arranged into frequency partitions and various subcarriers are designated as reference subcarriers. A frequency partition is a group of 19 OFDM subcarriers containing 18 data subcarriers and 1 reference subcarrier.

The subcarriers are located at evenly spaced frequency locations. The subcarrier locations are numbered from −546 to +546. In the waveform of FIG. 1, the subcarriers are at locations +356 to +546 and −356 to −546. This waveform may be used during an initial transitional phase preceding conversion to the all-digital waveform.

Each primary main sideband is comprised of ten frequency partitions, which are allocated among subcarriers 356 through 545, or −356 through −545. Subcarriers 546 and −546, also included in the primary main sidebands, are additional reference subcarriers. The amplitude of each subcarrier can be scaled by an amplitude scale factor.

In the hybrid waveform, the digital signal is transmitted in Primary Main (PM) sidebands on either side of the analog FM signal. The power level of each digital sideband is appreciably below the total power in the analog FM signal. The analog signal may be monophonic or stereo, and may include subsidiary communications authorization (SCA) channels.

Figure 2:
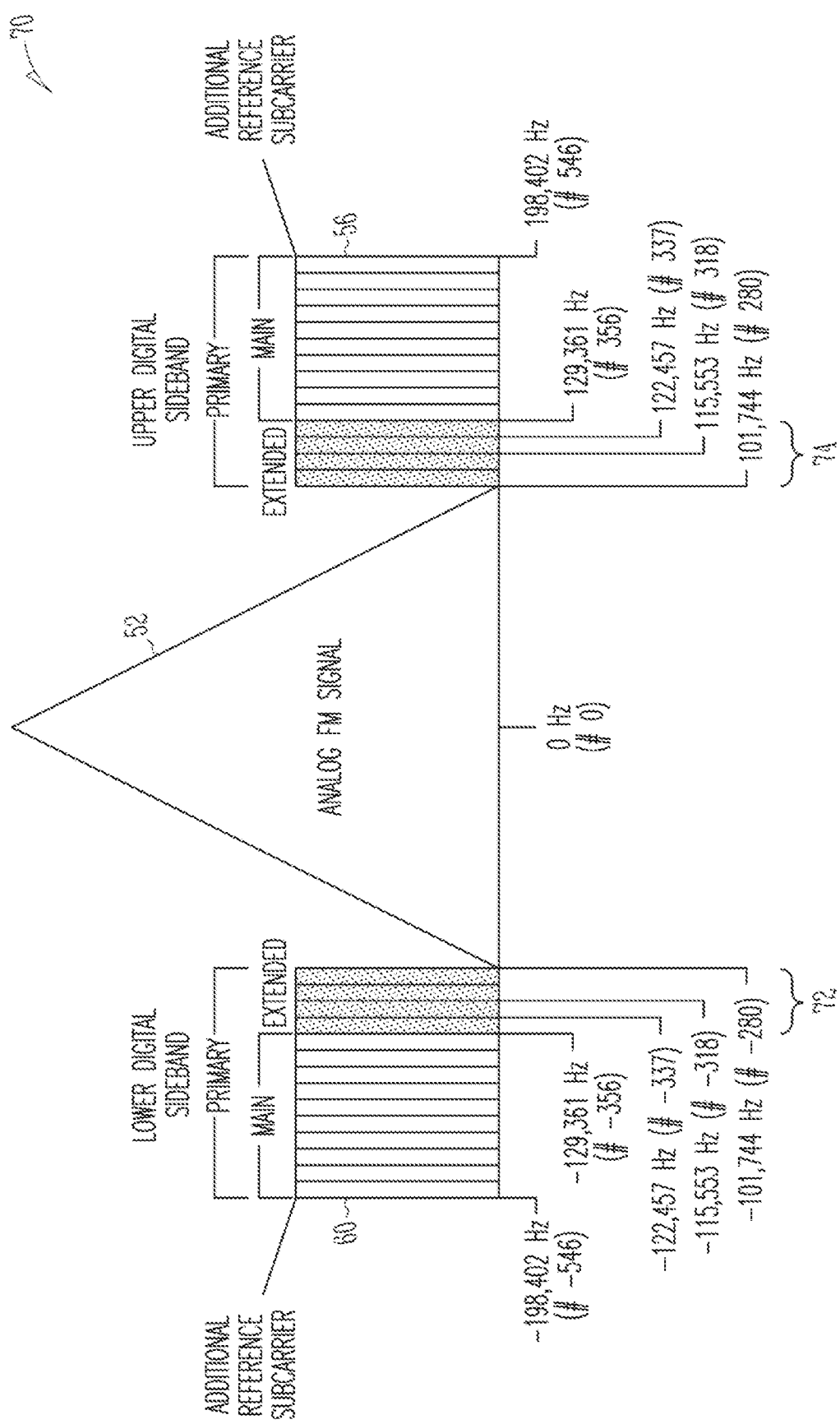
FIG. 2 is a schematic representation of an extended hybrid FM IBOC waveform.

FIG. 2 is a schematic representation of an extended hybrid FM IBOC waveform 70. The extended hybrid waveform is created by adding primary extended sidebands 72, 74 to the primary main sidebands present in the hybrid waveform. This additional spectrum, allocated to the inner edge of each Primary Main sideband, is termed the Primary Extended (PX) sideband. Depending on the service mode, one, two, or four frequency partitions can be added to the inner edge of each primary main sideband.

The extended hybrid waveform includes the analog FM signal plus digitally modulated primary main subcarriers (subcarriers+356 to +546 and −356 to −546) and some or all primary extended subcarriers (subcarriers+280 to +355 and −280 to −355). This waveform can be used during an initial transitional phase preceding conversion to the all-digital waveform.

Each primary main sideband includes ten frequency partitions and an additional reference subcarrier spanning subcarriers 356 through 546, or −356 through −546. The upper primary extended sidebands include subcarriers 337 through 355 (one frequency partition), 318 through 355 (two frequency partitions), or 280 through 355 (four frequency partitions). The lower primary extended sidebands include subcarriers −337 through −355 (one frequency partition), −318 through −355 (two frequency partitions), or −280 through −355 (four frequency partitions). The amplitude of each subcarrier can be scaled by an amplitude scale factor.

Figure 3:
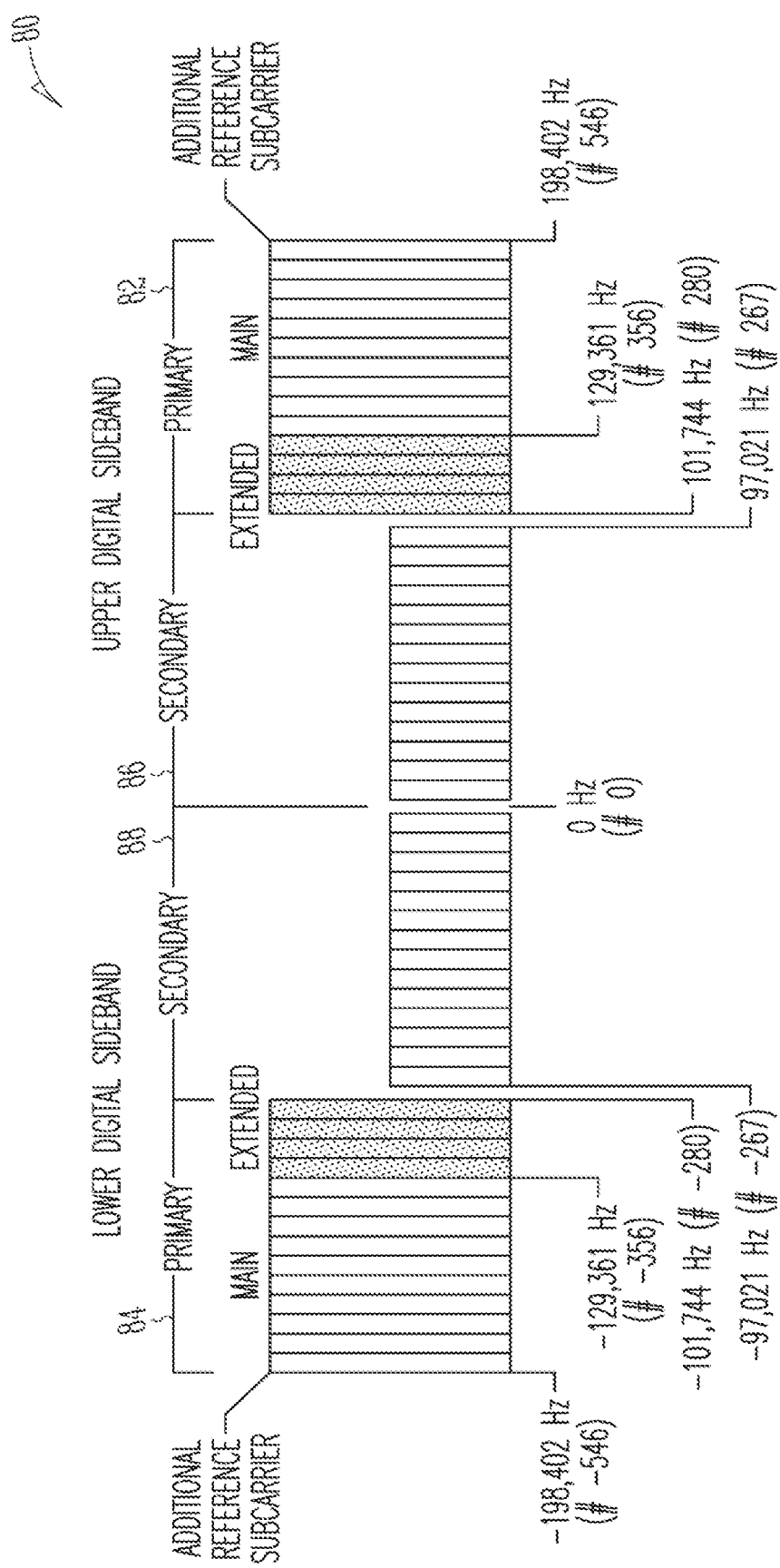
FIG. 3 is a schematic representation of the spectrum of an all-digital FM IBOC waveform.

FIG. 3 is a schematic representation of the spectrum of the all-digital FM waveform 80 to which this invention can be applied. The all-digital waveform is constructed by disabling the analog signal, fully expanding the bandwidth of the primary digital sidebands 82, 84, and adding lower-power secondary sidebands 86, 88 in the spectrum vacated by the analog signal. The all-digital waveform in the illustrated embodiment includes digitally modulated subcarriers at subcarrier locations −546 to +546, without an analog FM signal.

In addition to the ten main frequency partitions, all four extended frequency partitions are present in each primary sideband of the all-digital waveform. Each secondary sideband also has fourteen secondary broadband (SB) frequency partitions. Each secondary sideband spans subcarriers 1 through 267 or −1 through −267. Subcarriers 0, 268 through 279, and −268 through −279 are not populated. The total frequency span of the entire all-digital spectrum is 396,803 Hz. The amplitude of each subcarrier can be scaled by an amplitude scale factor. The secondary-sideband amplitude scale factors can be user-selectable.

All three waveform types (hybrid, extended hybrid, and all digital) conform to the currently allocated spectral emissions mask.

Figure 4:
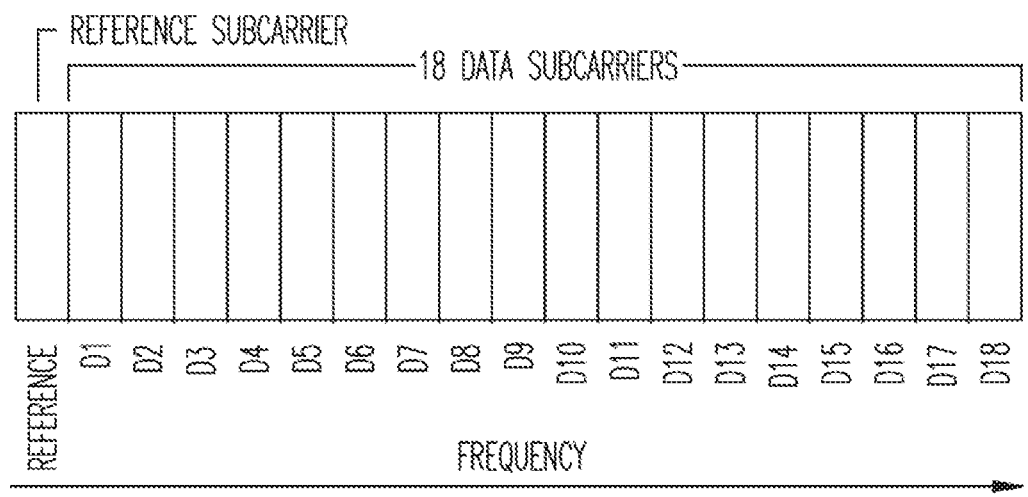
FIG. 4 is a schematic representation of a type of Frequency-Partition Ordering.
Figure 5:
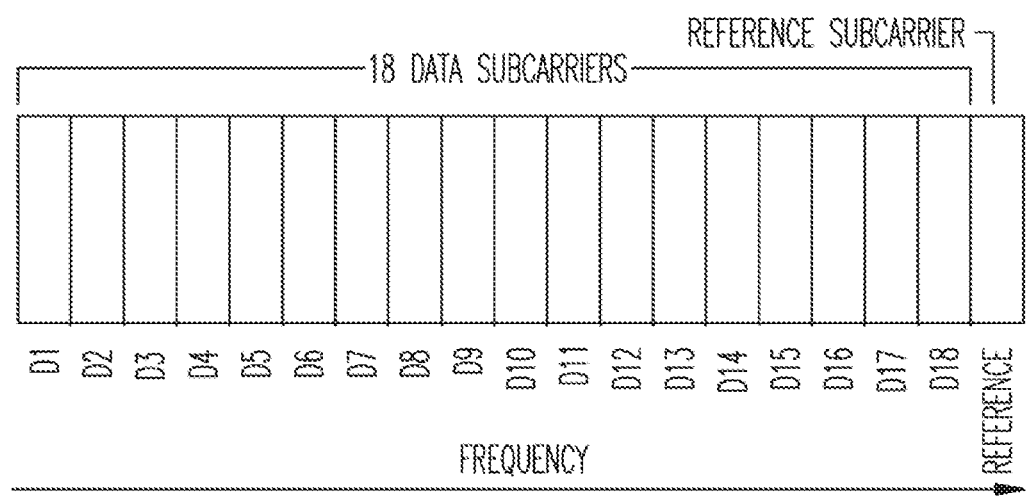
FIG. 5 is a schematic representation of another type of Frequency-Partition Ordering.

The OFDM subcarriers are assembled into frequency partitions. FIG. 4 is a schematic representation of a first type of Frequency-Partition Ordering. FIG. 5 is a schematic representation of a second type of Frequency-Partition Ordering. Each frequency partition consists of eighteen data subcarriers and one reference subcarrier, as shown in FIG. 4 (ordering A) and FIG. 5 (ordering B). The position of the reference subcarrier (ordering A or B) varies with the location of the frequency partition within the spectrum.

Figure 6:
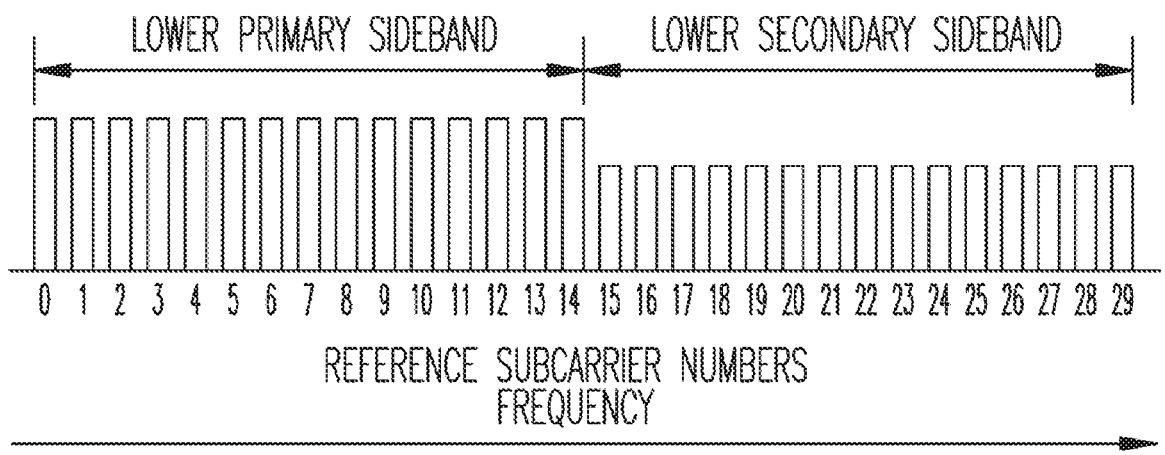
FIG. 6 is a schematic representation of lower sideband reference subcarriers.
Figure 7:
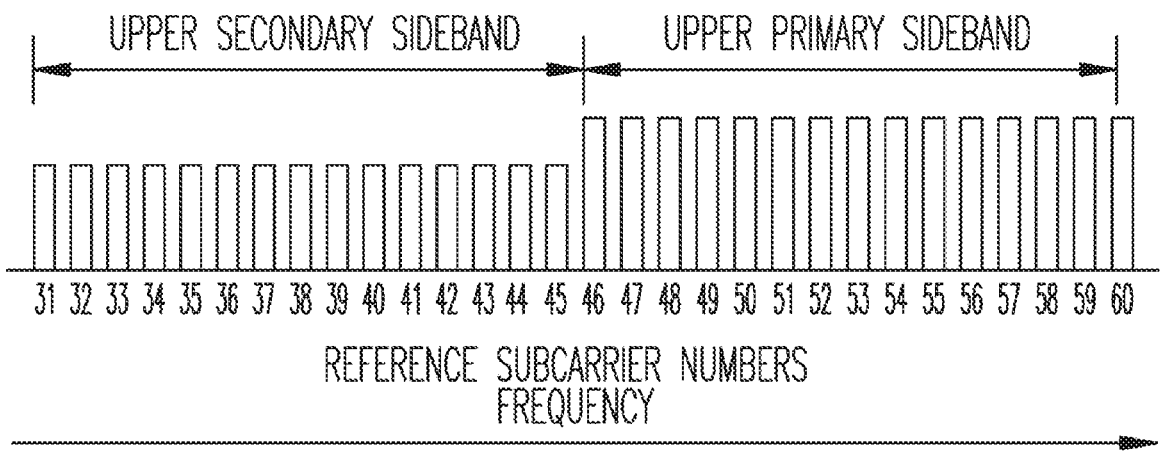
FIG. 7 is a schematic representation of upper sideband reference subcarriers.

Besides the reference subcarriers resident within each frequency partition, depending on the service mode, up to four additional reference subcarriers are inserted into the spectrum at subcarrier numbers −546, −1, 1, and 546. The overall effect is a regular distribution of reference subcarriers throughout the spectrum. For notational convenience, each reference subcarrier is assigned a unique identification number between 0 and 60. Note that reference subcarrier 30 (OFDM subcarrier 0) is not populated. All lower sideband reference subcarriers are shown in FIG. 6. All upper sideband reference subcarriers are shown in FIG. 7.

FIGS. 1-3 show the subcarrier number and center frequency of certain key OFDM subcarriers. The center frequency of a subcarrier is calculated by multiplying the subcarrier number by the OFDM subcarrier spacing Δf. The center of subcarrier 0 is located at 0 Hz. In this context, center frequency is relative to the Radio Frequency (RF) allocated channel. For example, the upper Primary Main sideband is bounded by subcarriers 356 and 546, whose center frequencies are located at 129,361 Hz and 198,402 Hz, respectively. The frequency span of the Primary Main sideband is 69,041 Hz (198,402−129,361).

Figure 8:
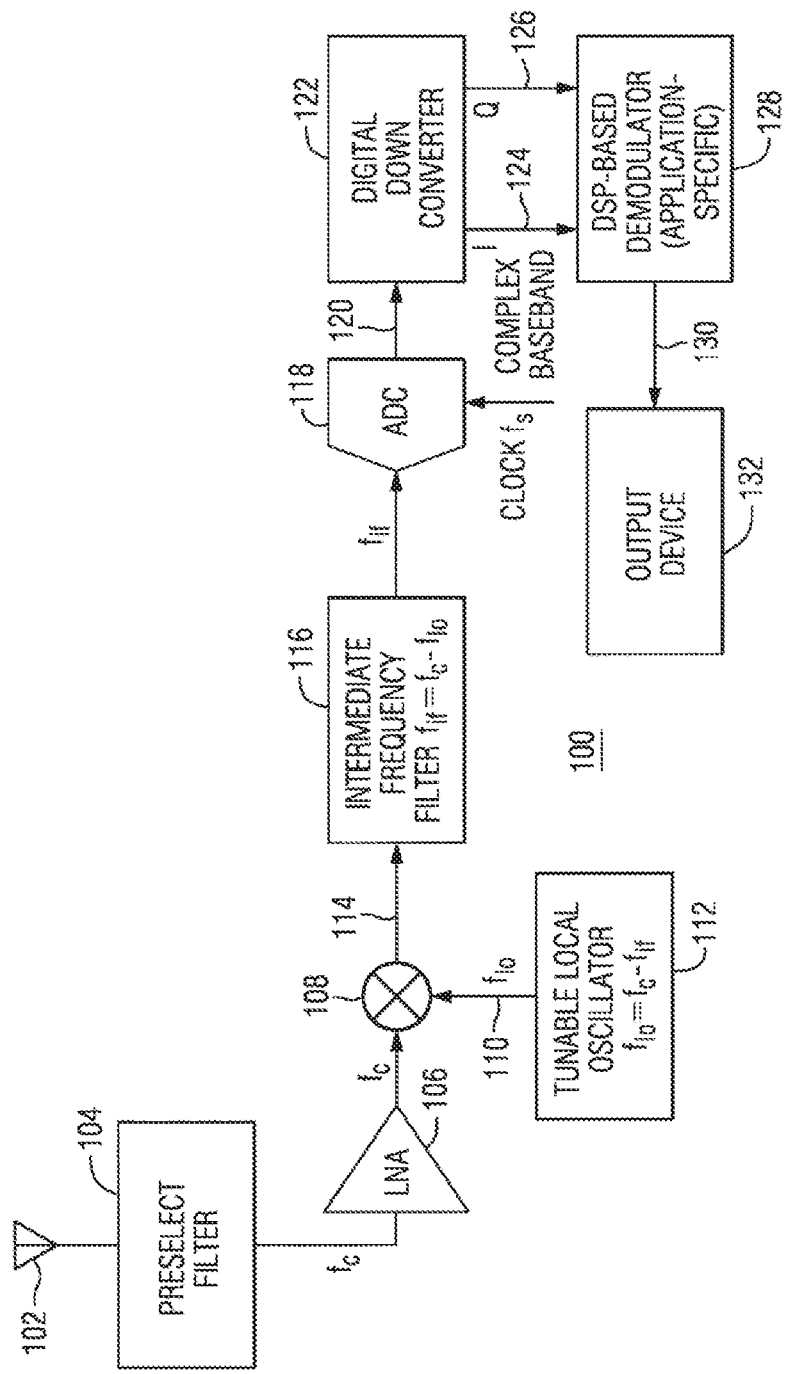
FIG. 8 is a block diagram of portions of an example of a radio receiver.

FIG. 8 is a block diagram of portions of an example of a receiver 100 that can process IBOC radio signals in accordance with an embodiment of this invention. In the example, an IBOC radio signal is received on antenna 102. A bandpass preselect filter 104 passes the frequency band of interest, including the desired signal at frequency $f_c$, but rejects the image signal at $(f_c-2f_{if})$ (for a low sideband injection local oscillator). Low noise amplifier 106 amplifies the signal. The amplified signal is mixed in mixer 108 with a local oscillator signal $f_{lo}$ supplied on line 110 by a tunable local oscillator 112. This creates sum $(f_c+f_{lo})$ and difference $(f_c-f_{lo})$ signals on line 114. Intermediate frequency filter 116 passes the intermediate frequency (IF) signal $f_{if}$ and attenuates frequencies outside of the bandwidth of the modulated signal of interest. An analog-to-digital converter 118 operates using a clock signal $f_s$ to produce digital samples on line 120 at a rate $f_s$. Digital down converter 122 frequency shifts, filters and decimates the signal to produce lower sample rate in-phase and quadrature signals on lines 124 and 126. Processing circuitry, such as digital signal processor 128 or other type of processor, then provides additional signal processing to produce an output signal on line 130 for output device 132.

Figure 9:
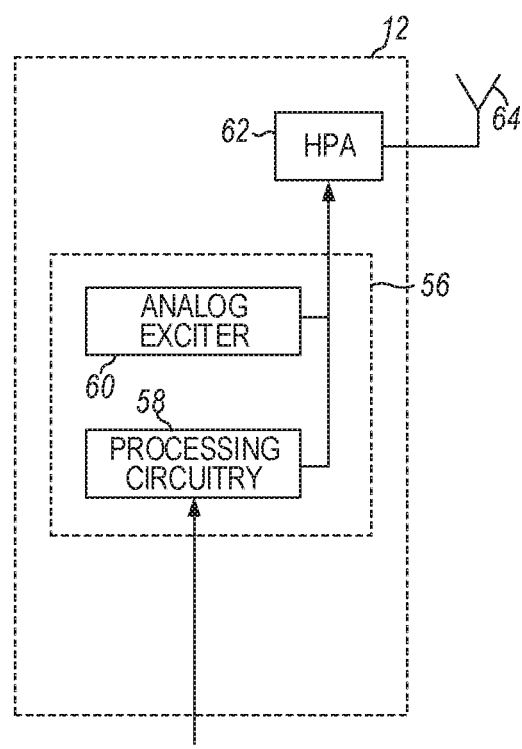
FIG. 9 is a functional block diagram of an example of a radio transmitter.

FIG. 9 is a functional block diagram of a radio transmitter 12 that can be used to broadcast an FM IBOC radio signal. The radio transmitter can include an exciter 56 and an analog exciter 60. Data for broadcasting is passed to the exciter 56, which produces the FM IBOC waveform. The exciter includes processing circuitry 58, digital up-converter (not shown), and RF up-converter (not shown). The exciter accepts exciter link data and modulates the digital portion of the IBOC radio waveform. The RF up-converter of the exciter up-converts the analog signal to the proper in-band channel frequency. The up-converted signal is then passed to the high-power amplifier 62 and antenna 64 for broadcast. In some examples, the exciter adds MPS audio to a digital waveform and the radio transmitter does not include the analog exciter 60.

Figure 10A:
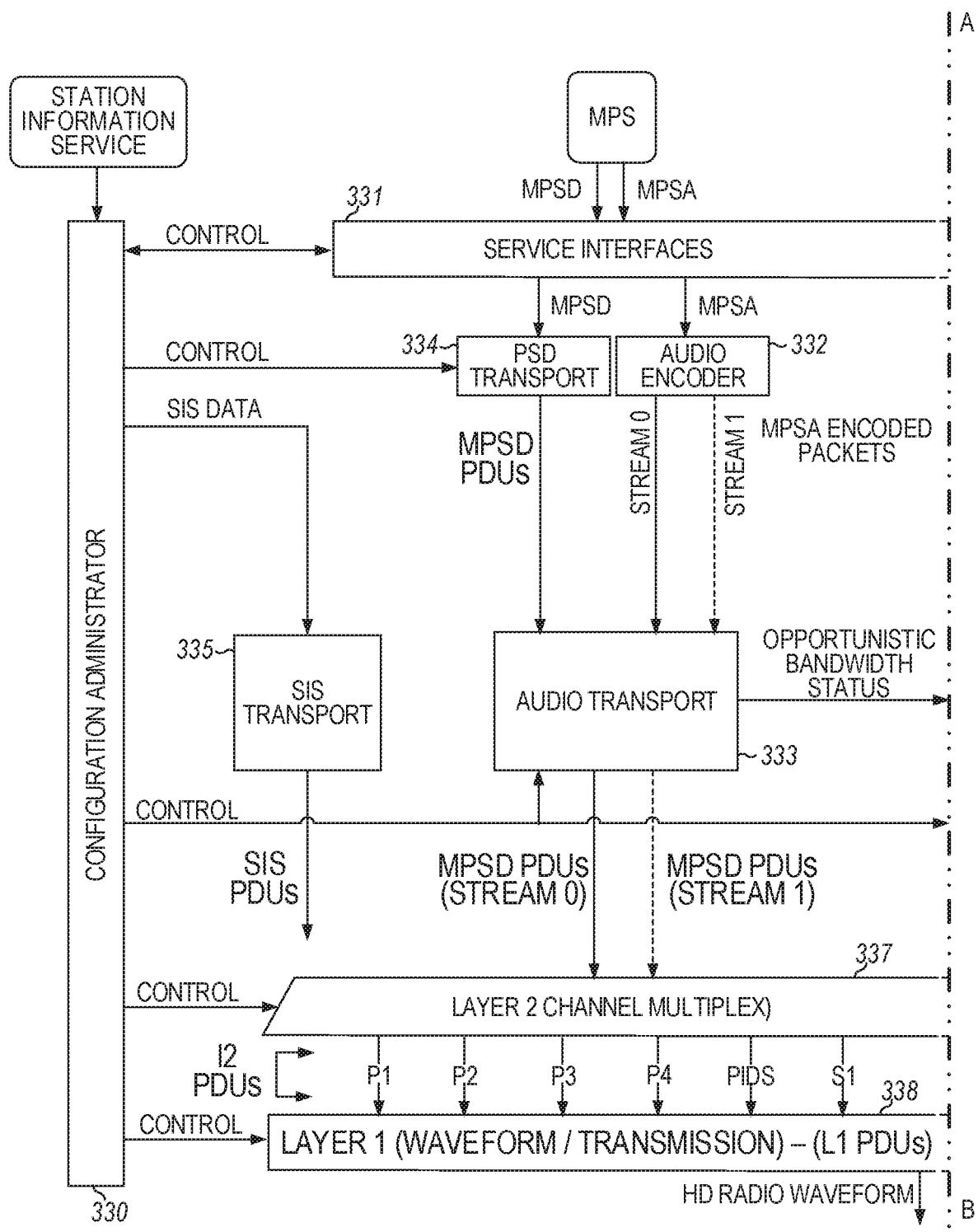
FIGS. 10A and 10B are diagrams of an FM IBOC radio transmitter logical protocol stack.
Figure 10B:
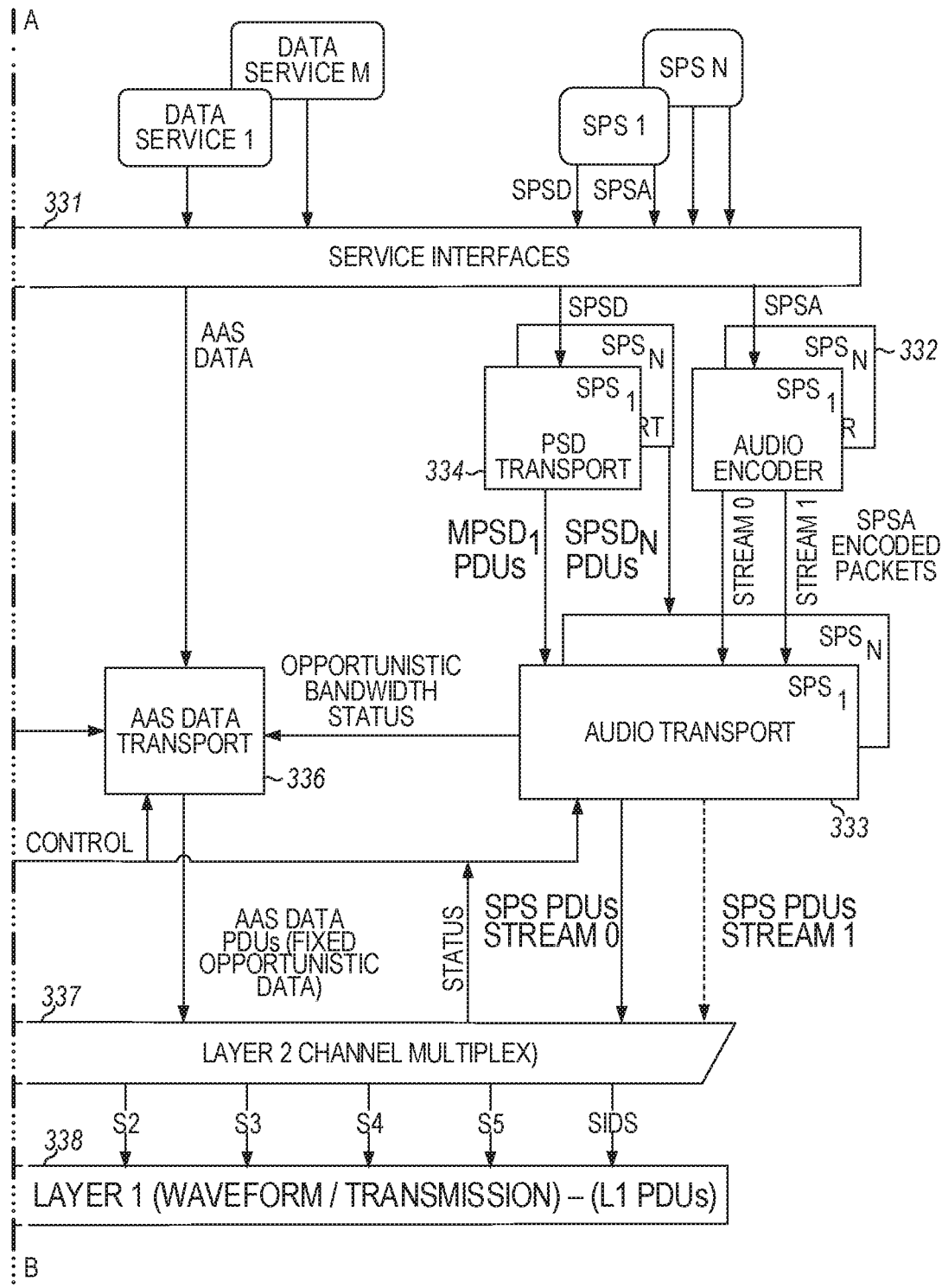

FIGS. 10A and 10B are diagrams of an IBOC logical protocol stack from the transmitter perspective. The logical protocol stack can be implemented using the processing circuitry 58 of the radio transmitter in FIG. 9 that can include one or more processors. From the receiver perspective, the protocol stack is traversed in the opposite direction. Most of the data being passed between the various entities within the protocol stack are in the form of protocol data units (PDUs). A PDU is a structured data block that is produced by a specific layer (or process within a layer) of the protocol stack. The PDUs of a given protocol layer may encapsulate PDUs from the next higher layer of the stack and/or include content data and protocol control information originating in the layer (or process) itself. The PDUs generated by each layer (or process) in the transmitter protocol stack are inputs to a corresponding layer (or process) in the receiver protocol stack.

As shown in FIGS. 10A and 10B, there is a configuration administrator 330, which is a system function that supplies configuration and control information to the various entities within the protocol stack. The configuration/control information can include user-defined settings, as well as information generated from within the system such as GPS time and position. The service interfaces 331 represent the interfaces for all services except station information services (SIS). The service interface may be different for each of the various types of services. For example, for main program service (MPS) audio and supplemental program service (SPS) audio, the service interface may be an audio card. For MPS data and SPS data, the interfaces may be in the form of different application program interfaces (APIs). For all other data services, the interface is in the form of a single API.

An audio codec 332 encodes both MPS audio and SPS audio to produce a core stream (Stream 0) and optional enhancement stream (Stream 1) of MPS and SPS audio encoded packets, which are passed to audio transport 333. Audio codec 332 also relays unused capacity status to other parts of the system, thus allowing the inclusion of opportunistic data. MPS and SPS data is processed by program service data (PSD) transport 334 to produce MPS and SPS data PDUs, which are passed to audio transport 333. Audio transport 333 receives encoded audio packets and PSD PDUs and outputs bit streams containing both compressed audio and program service data.

The SIS transport 335 receives SIS data from the configuration administrator and generates SIS PDUs. A SIS PDU can contain station identification and location information, program type, as well as absolute time and position correlated to GPS. The Advanced Application Service (AAS) data transport 336 receives AAS data from the service interface, as well as opportunistic bandwidth data from the audio transport, and generates AAS data PDUs, which can be based on quality of service parameters.

The transport and encoding functions are collectively referred to as Layer 4 of the protocol stack, and the corresponding transport PDUs are referred to as Layer 4 PDUs (or L4 PDUs). Layer 2 (L2), which is the channel multiplex layer 337, receives transport PDUs from the SIS transport, AAS data transport, and audio transport, and formats them into Layer 2 PDUs. An L2 PDU may include protocol control information, Reed Solomon parity bytes, and a payload, which can be audio, data, or a combination of audio and data. L2 PDUs are routed through the correct logical channels to Layer 1 (L1) or the physical layer. A logical channel is a signal path that conducts the L2 PDUs through Layer 1 338 with a specified grade of service determined by a service mode of the IBOC radio signal. The service mode is a specific configuration of operating parameters specifying throughput, performance level, and selected logical channels.

There can be multiple logical channels passed between Layer 2 and Layer 1, and the specific logical channels and their grade of service is determined by the service mode. The number of active physical-layer logical channels and the characteristics defining them vary among the different service modes. Status information is also passed between Layer 2 and the physical layer. Layer 1 converts the PDUs from Layer 2 and system control information into an FM IBOC radio signal for transmission. Layer 2 and Layer 1 processing can include scrambling, channel encoding, interleaving, OFDM subcarrier mapping, and OFDM signal generation. The output of OFDM signal generation is a complex, baseband, time-domain pulse representing the digital portion of an IBOC signal for a particular symbol. Discrete symbols are concatenated to form a continuous time domain waveform, which is modulated to create an IBOC signal waveform for transmission.

As with most data transfer systems, improved robustness and capacity of the data is desired. In some cases, it is desirable that any improvements be backward compatible with existing service modes. New non-backward compatible (NBC) service modes may also be desirable for even higher capacity in new geographical regions or for new radio signal applications, such as for control of autonomous vehicles, configuration of connected cars, broadcast of global positioning system (GPS) correction data for centimeter-scale positioning, etc. Improved service modes to meet the demands for increased capacity and robustness are described below.

New Service Modes

Currently, there are four primary service modes available in FM IBOC systems: MP1, MP3, MP5, and MP6. New service modes have been designed, however, to increase capacity using QAM and improve robustness using a two-dimensional diversity scheme. Specifically, time diversity is afforded by simulcasting input data on a main component and a delayed backup component, and frequency diversity is realized by simulcasting input data on upper and lower digital sidebands. Because these new service modes feature frequency diversity between upper and lower sidebands, as well as time diversity between main and backup components, they can be collectively referred to as Lower-Upper-Main-Backup (LUMB) service modes. This two-dimensional diversity of frequency and time enhances signal robustness in the presence of selective fading, interference, blockages, and other channel outages—especially those that may occur for a mobile radio receiver, such as a radio receiver in a moving vehicle, for example.

The new LUMB service modes defined herein are designated as MP1X, MP3X, DSB1, SSB1, and MS5. MP1X and MP3X increase the capacity of the MP1 and MP3 service modes, respectively, in a backward-compatible manner, and generate extended hybrid FM IBOC radio signals. DSB1 and SSB1 are NBC service modes that can further increase capacity and/or robustness. SSB1 is identical to DSB1, except it transmits only one sideband. MS5 is a secondary service mode used in all-digital waveforms. MS5 is identical to DSB1, except it configures the secondary (and not primary) subcarriers and swaps the upper and lower sidebands.

The Layer 1 processing circuitry receives input bits from the L2 PDU via one or more logical channels. The input bits can include MPS audio, MPS data, SPS audio, SPS data, SIS data, and AAS data. The processing circuitry for each LUMB service mode applies forward error correction (FEC) channel encoding, interleaving, OFDM subcarrier mapping, and OFDM modulation to the input data bits.

The FEC channel encoding adds error correction bits to the input data bits prior to transmission. The error correction bits are used by the radio receiver to correct bit errors and regenerate the bit stream. FEC encoding can include Complementary Punctured Pair Convolutional (CPPC) coding. A CPPC code has complementary-like properties in two dimensions. One dimension is in frequency (between Upper and Lower Sidebands), and the other dimension is in time (between main and backup components). CPPC encoding includes the ability to puncture the original FEC convolutional code in various overlapping partitions, including Main, Backup, Lower Sideband and Upper Sideband. While the four partitions are included in one error correction algorithm, each of the four overlapping partitions can survive on its own as a good error correction code.

For instance, the performance of the Lower and Upper Sidebands can be optimized as a pair of symmetric complementary non-overlapping partitions that can each survive independently. If one sideband were compromised by interference, the other sideband could still successfully receive the data bits. Similarly, the Backup and Main components can survive independently. If, for example, a vehicle drove under a bridge and lost the main component, the time-diverse backup component could still be received without degradation. Because of this frequency diversity and time diversity, CPPC encoding can be considered to have LUMB properties.

Therefore, in each of the MP1X, MP3X, DSB1, SSB1, and MS5 service modes, FEC-encoded bits from one or more of the logical channels in the L2 PDU are distributed into a main component and a backup component. The data in the backup component is delayed by a specified time relative to the main component. This delay provides time diversity to the data transmitted using the broadcast FM IBOC radio signal. Additionally, the processing circuitry assigns input bits to upper and lower sidebands, which provides frequency diversity to the broadcast IBOC radio signal.

The IBOC radio signal is also interleaved in both time and frequency in a two-dimensional interleaver matrix. The interleaver reorders the FEC-encoded bits to disperse burst errors typical of a fading channel. The main FEC-encoded bits are interleaved in a main interleaver, and the backup FEC-encoded bits are interleaved in a separate backup interleaver. The interleaver uses equations to direct encoded bits to specific interleaver partitions within the interleaver matrix. An interleaver partition can be viewed as a smaller independent interleaver.

After interleaving, the main and backup interleavers are combined into a single composite interleaver that is structured in matrix format. Main interleaver partitions are combined with corresponding backup interleaver partitions. For example, main interleaver partition 0 is combined with backup interleaver partition 0, main interleaver partition 1 is combined with backup interleaver partition 1, and so forth. The combining itself consists of writing alternating bits from each row of the constituent main and backup interleavers into the corresponding row of the composite interleaver. For example, each row in a composite interleaver partition would consist of M1, B1, M2, B2, M3, B3 etc., where M1 is the first bit within a particular row of the main interleaver, and B1 is the first bit within the corresponding row of the backup interleaver. Thus, the width of the composite interleaver matrix will be twice that of its main and backup constituents.

After combining, each composite interleaver partition is mapped to a physical frequency partition, and then each row in the interleaver matrix is mapped to an OFDM symbol. One row of an interleaver matrix is processed every OFDM symbol time to produce one output vector that is a frequency-domain representation of the OFDM symbol. OFDM modulation is then performed to create a complex, baseband, time-domain pulse representing the digital portion of the IBOC signal for that particular symbol.

Each of the MP1X, MP3X, DSB1, and SSB1 service modes may employ any one of three digital modulation formats for each OFDM subcarrier: QPSK, sixteen-point quadrature amplitude modulation (16-QAM), or sixty-four-point quadrature amplitude modulation (64-QAM). The MS5 service mode uses QPSK modulation. QPSK can be considered a special case of quadrature amplitude modulation (four-point quadrature amplitude modulation or 4-QAM) and uses two code bits per subcarrier per symbol. 16-QAM uses four code bits per subcarrier per symbol, and 64-QAM uses six code bits per subcarrier per symbol. Thus, 16-QAM has twice the throughput of 4-QAM, and 64-QAM has three times the throughput of 4-QAM.

FEC encoding, interleaving, and OFDM symbol mapping may include a set of parameters uniquely tailored to the specified service mode and modulation type. The specifics of each new LUMB service mode are described next.

MP1X Service Mode

In the MP1X service mode, Layer 1 generates an extended hybrid FM IBOC radio signal that is backward compatible with existing service mode MP1, and includes multiple OFDM subcarriers in the upper primary main (PM) and primary extended (PX) sidebands, and the lower PM and PX sidebands. The multiple subcarriers in the upper and lower PM sidebands each form ten frequency partitions. To increase capacity over the MP1 service mode, 76 additional subcarriers are added to each of the upper and lower PX sidebands of the MP1X service mode. The 76 subcarriers are arranged into four additional frequency partitions (19 subcarriers per partition) in each of the upper and lower PX sidebands for a total of eight additional frequency partitions.

The added PX sidebands are arranged closer to the analog host signal than the PM sidebands. PX sidebands are not always transmitted because they could potentially interfere with the analog host signal due to their spectral proximity. Newer versions of radio receivers may include filtering circuitry that rejects this interference and processes signals transmitted using the new PX sidebands. The IBOC radio transmitters could transfer information to legacy receivers and assume that the legacy receivers do not receive information included in the newly added sidebands.

There may be five primary logical channels in the FM IBOC radio system that can be designated as P1, P2, P3, P4, and PIDS, as shown in the example of FIGS. 10A and 10B. In the MP1X service mode, the PM sidebands are mapped to the P1 and PIDS logical channels, and the PX sidebands are mapped to the P4 logical channel. Only logical channels P1 and PIDS are active in the legacy MP1 service mode. Since MP1X is a backward-compatible service mode, new FM IBOC receivers tuned to a radio station broadcasting new service mode MP1X would receive not only the original P1 and PIDS logical channels, but also the additional capacity of the P4 logical channel. Legacy receivers tuned to a radio station broadcasting new service mode MP1X would continue to receive the P1 and PIDS logical channels as if service mode MP1 were being transmitted.

Figures 11, 12, 13:
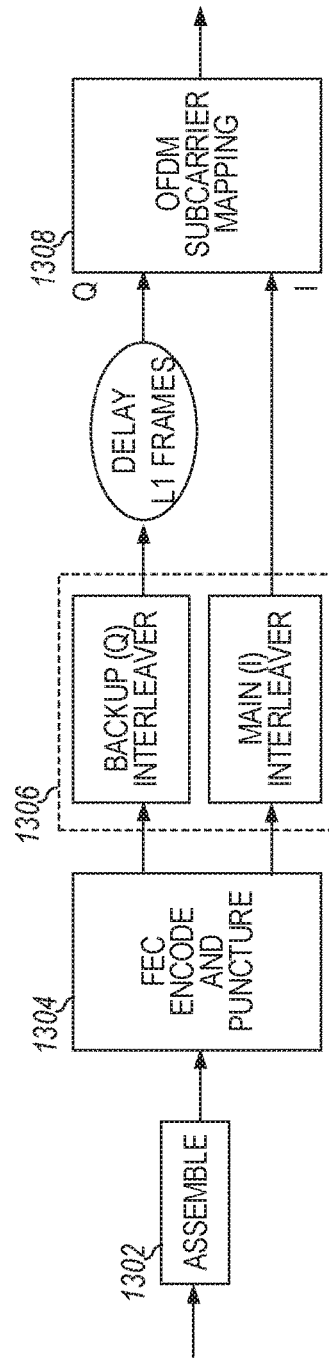
FIG. 11 is a table showing an example of frequency-partition mapping for the MP1X service mode with four-point quadrature amplitude modulation (4-QAM).
FIG. 12 is a Table showing the FEC puncture pattern for the MP1X service mode with 4-QAM.
FIG. 13 is a block diagram of an example of a portion of the circuit stages used to prepare information bits for transmitting in the MP1X or MP3X service mode.

FIG. 13 is a block diagram of an example of a portion of the stages used to prepare input P4 bits for transmitting service mode MP1X. The stages include an assembly stage 1302 to assemble the input bits into groups, an FEC encoding stage 1304 to encode and puncture the assembled bit groups, an interleaving stage 1306, and an OFDM subcarrier mapping stage 1308 that maps the interleaved bits to the OFDM subcarriers. The output of the OFDM subcarrier mapping stage is provided to an OFDM modulation stage (not shown). The stages are included in the Layer 1 protocol layer implemented by the processing circuitry.

The MP1X service mode uses FEC channel encoding. FIG. 12 is a Table showing the FEC puncture pattern for the MP1X service mode when 4-QAM is used. The rows of the Table are the outputs of the three generator polynomials of the convolutional code G, e.g., $G=[G1=557_{oct}, G2=663_{oct}, G3=711_{oct}]$. Each column of the Table corresponds to one information bit input to the convolutional encoder. Some of the code bits are punctured. Punctured bits are not used and are labeled as N/A in the Table. Puncturing increases the code rate of the service mode to fit the capacity afforded by the number of available OFDM subcarriers.

As explained above, the FEC encoder uses a CPPC coding technique in which the original composite FEC convolutional code is comprised of multiple overlapping partitions, including Main, Backup, Lower Sideband and Upper Sideband. Each of the four overlapping partitions can survive on its own as a good error correction code. This provides signal robustness should one of the code partitions be corrupted by the channel. However, if all four partitions survive the effects of the channel, they can work together to form a single, stronger composite code. For instance, in the MP1X service mode with 4-QAM modulation, each of the main and backup (or upper and lower) code partitions generates four bits of encoded information for every three input bits. Using all code partitions, the composite code generates eight FEC encoded bits for every three information bits.

The puncture pattern in FIG. 12 assigns the non-punctured bits to either a main (M) encoded component of the FEC encoder or a backup (B) encoded component. The puncture pattern can be viewed as an ordered mapping of vectors $v_M$ (for the main component of the channel-encoded bits) and vi (for the backup component). Vector vu is formed with the non-punctured code bits from the Table in FIG. 12 that have an M designation. Starting with the first column and row, any code bits with the M designation are extracted from the three rows. Next, the M code bits from the second column are extracted, and so on until all columns of M code bits have been extracted (e.g., $v_M$=[2, 4, 3, 5, 7, 1, 6, 0] in the Table. Vector $v_B$ is formed in the same manner using the B code bits (e.g., $v_B$=[7, 5, 1, 3, 6, 2, 4, 0] in the Table.

After FEC encoding and puncturing, the encoded bits are provided to the interleaver stage. Encoded bits from the P4 logical channel are interleaved in the PX interleaver matrix, while the PIDS logical channel is interleaved with the P1 logical channel in the PM interleaver matrix. The transfer frame characteristics for the interleaver for the PX sideband are summarized in the Table of FIG. 14 for the MP1X service mode with 4-QAM.

In the MP1X service mode, the P4 logical channel feeds two interleaver components: the main (PXM) and the backup (PXB), which are eventually mapped to the Inphase (I) and Quadrature (Q) symbol constellation components, respectively. Main encoded components are interleaved in main interleaver matrix PXM, and backup encoded components—after the application of diversity delay—are interleaved in backup interleaver matrix PXB.

An interleaver matrix is divided into J interleaver partitions. The numbers in the Table of FIG. 12 following either the M or B indicate an interleaver partition of the interleaver stage. Vectors $v_M$ and $v_B$ consist of the interleaver partition assignments for each main and backup code bit, respectively. Each interleaver partition is divided into B interleaver blocks. An interleaver block spans 32 rows and C=18 columns for each main and backup component. Thus, the dimensions for each interleaver partition in a given interleaver matrix is (B·32)×C.

The input to each interleaver is a vector of channel encoded bits indexed from i=0, 1 . . . N−1. The output of each interleaver is a (B·32)×(J·C) matrix of encoded bits destined for OFDM subcarrier mapping. The mapping of each encoded bit to a location in the interleaver matrix is calculated using a set of equations. The interleaver parameters for the equations are summarized in Table 1 below.

TABLE 1

Interleaver Parameters

| Interleaver Parameter | Interleaver Parameter Definition |
|---|---|
| J | The number of interleaver partitions per interleaver matrix. |
| B | The number of interleaver blocks per interleaver partition. |

TABLE 1-continued

Interleaver Parameters

| Interleaver Parameter | Interleaver Parameter Definition |
|---|---|
| C | The number of columns per interleaver block. |
| v | Partition assignment vector used to control the relative ordering of interleaver partitions in the interleaver matrix. |
| $I_0$ | Index offset value used in $k_i$ calculation |
| N | The number of bits per interleaver input sequence. |

The interleaver equations are computed over N bits (i=0, 1 . . . N−1) of the partition assignment vector v (which represents either $v_M$ or $v_B$ described above). An index into the vector is computed to retrieve an interleaver partition assignment, or $$\text{partition}_i = v_{MOD(i, length(v))}.$$

The interleaver block assignment within an interleaver partition can be determined as $$block_i = \text{MOD}\left[\text{INT}\left(\frac{i}{J}\right) + 7 \cdot partition_i, B\right].$$

The row and column assignments of an interleaver matrix can be determined as $$\text{row}(k_i) = \text{MOD}(11, k_i, 32),$$

$$\text{column}(k_i) = \text{MOD}\left[11 \cdot k_i + \text{INT}\left(\frac{k_i}{32 \cdot 9}\right), C\right],$$

where the index $k_i$ is defined as $$k_i = \text{INT}\left(\frac{i}{J \cdot B}\right) + \frac{I_0}{J \cdot B}.$$

In the MP1X service mode with 4-QAM, the main partition assignment vector $v_M$ directs encoded bits into the main interleaver matrix (PXM) using the parameters shown in Table 2 below. Using these parameters, the PXM interleaver matrix is a 512-row by 144-column matrix. The input encoded bit sequence may be dispersed over the full row and column span of the PXM interleaver matrix.

TABLE 2

PXM Interleaver Parameter Values for MP1X and 4-QAM

| J | B | C | $I_0$ | N |
|---|---|---|---|---|
| 8 | 16 | 18 | 0 | 73728 |

The backup partition assignment vector $v_B$ likewise directs encoded bits into the PX backup (PXB) interleaver matrix using the parameters shown in Table 3 below. The PXB interleaver matrix is a 64-row by 144-column matrix. The input encoded bit sequence may be dispersed over the full row and column span of the PXB interleaver matrix.

TABLE 3

PXB Interleaver Parameter Values for MP1X and 4-QAM

| J | B | C | $I_0$ | N |
|---|---|---|---|---|
| 8 | 2 | 18 | 0 | 9216 |

Following interleaving, the main and backup PX interleavers can be combined into a single composite interleaver matrix before mapping the interleaver contents to OFDM subcarriers. The lower numbered interleaver partitions (starting at 0) generally can be mapped to the lower sidebands, and the higher numbered partitions generally can be mapped to the upper sidebands. FIG. 11 is a Table showing an example of mapping interleaver partitions to frequency partitions for the PX sidebands in service mode MP1X with 4-QAM (or QPSK) modulation. In FIG. 11, the FROM refers to the interleaver partition, and the TO refers to the frequency partition to which it is being mapped.

After assigning interleaver partitions to frequency partitions, the bits of the interleaver matrices from all active sidebands can be transferred in parallel to the OFDM subcarrier mapping stage, which maps a row of bits from each interleaver matrix to the OFDM subcarriers. The bits in the main and backup interleavers can be mapped generally to the Inphase (I) and Quadrature (Q) constellation axes, respectively, of the OFDM subcarriers. The output of the OFDM subcarrier mapping stage is a frequency-domain representation of the OFDM symbol. OFDM modulation can then be performed to create a complex, baseband, time-domain pulse representing the digital portion of the IBOC signal for that particular symbol.

The MP1X service mode can transfer data at 36 kilobits per second (36 kbps) using 4-QAM. This throughput can be doubled (to 72 kbps) or nearly tripled (to 96 kbps) at the expense of robustness using modulation types 16-QAM or 64-QAM, respectively.

FIG. 15 is a Table showing an example of interleaver-partition to frequency-partition mapping for the MP1X service mode with 16-QAM. Compared to the 4-QAM example, for 16 QAM there are twice as many interleaver partitions as frequency partitions. The TO frequency partitions in FIG. 15 show a most significant bit (MSB) interleaver partition and a least significant bit (LSB) interleaver partition assigned to each frequency partition to permit mapping from twice as many interleaver partitions. Thus, there are two I bits and two Q bits assigned to each OFDM subcarrier in each OFDM symbol (instead of just one for 4-QAM), resulting in 16 constellation points.

FIG. 16 is a Table showing the FEC puncture pattern for the MP1X service mode when 16-QAM is used. As in the 4-QAM example, the rows of the Table are the outputs of the three generator polynomials of the convolutional code G, but there are twice as many columns as in the 4-QAM example because of the doubling of interleaver partitions.

Vector $v_M$ is formed with the non-punctured code bits from the Table in FIG. 16 that have an M designation. Starting with the first column and row, any code bits with the M designation are extracted until all columns of M code bits have been extracted (e.g., $v_M$=[4, 8, 7, 10, 14, 3, 13, 1, 5, 9, 6, 11, 15, 2, 12, 0] in the Table). Vector $v_B$ is formed in the same manner using the B code bits (e.g., $v_B$=[14, 10, 3, 7, 13, 4, 8, 1, 15, 11, 2, 6, 12, 5, 9, 0] in the Table). As with 4-QAM, each of the main and backup (or upper or lower) code partitions generate four bits of encoded information for every three input bits. The composite code generates eight FEC encoded bits for every three input bits.

In the MP1X service mode with 16-QAM, the main partition assignment vector $v_M$ directs encoded bits into the main interleaver matrix (PXM) using the parameters shown in Table 4 below. Using these parameters, the PXM interleaver matrix is a 512-row by 288-column matrix. The input encoded bit sequence may be dispersed over the full row and column span of the PXM interleaver matrix.

TABLE 4

PXM Interleaver Parameter Values for MP1X and 16-QAM

| J | B | C | $I_0$ | N |
|---|---|---|---|---|
| 16 | 16 | 18 | 0 | 147456 |

The backup partition assignment vector $v_B$ directs encoded bits into the PXB interleaver matrix using the parameters shown in Table 5 below. Using these parameters, the PXB interleaver matrix is a 64-row by 288-column matrix. The input encoded bit sequence may be dispersed over the full row and column span of the PXB interleaver matrix.

TABLE 5

PXB Interleaver Parameter Values for MP1X and 16-QAM

| J | B | C | $I_0$ | N |
|---|---|---|---|---|
| 16 | 2 | 18 | 0 | 18432 |

Modulation type 64-QAM can also be used in the MP1X service mode. FIG. 17 is a Table showing an example of interleaver-partition to frequency-partition mapping for the MP1X service mode with 64-QAM. Compared to the 4-QAM example, for 64-QAM there are three times as many interleaver partitions as frequency partitions. The TO frequency partitions in FIG. 17 show MSB, XSB, and LSB interleaver partitions assigned to each frequency partition to permit mapping from three times as many interleaver partitions. Thus, there are three I bits and three Q bits assigned to each OFDM subcarrier in each OFDM symbol (instead of just one for 4-QAM or two for 16-QAM), resulting in 64 constellation points.

FIG. 18 is a table showing the FEC puncture pattern for the MP1X service mode when 64-QAM is used. As in the 4-QAM and 16-QAM examples, the rows of the table are the outputs of the three generator polynomials of the convolutional code G, but there are 16 columns in the table.

Vector $v_M$ is formed with the non-punctured code bits from the Table in FIG. 18 that have an M designation. Starting with the first column and row, any code bits with the M designation are extracted until all columns of M code bits have been extracted (e.g., $v_M$=[12, 3, 7, 13, 9, 23, 16, 2, 5, 18, 8, 22, 19, 0, 6, 17, 11, 21, 15, 1, 4, 14, 10, 20] in the Table). Vector $v_B$ is formed in the same manner until all columns of B code bits are extracted (e.g., $v_B$=[0, 12, 23, 9, 2, 13, 7, 16, 22, 8, 3, 18, 5, 19, 21, 11, 6, 17, 1, 15, 20, 10, 4, 14] in the Table). Unlike the 4-QAM and 16-QAM examples, each of the main and backup (or upper or lower) code partitions generate three bits of encoded information for every two input bits. The composite code generates three FEC encoded bits for every input bit.

In the MP1X service mode with 64-QAM, the main partition assignment vector $v_M$ directs encoded bits into the main interleaver matrix (PXM) using the parameters shown in Table 6 below. Using these parameters, the PXM interleaver matrix is a 512-row by 432-column matrix. The sequence may be dispersed over the full row and column span of the PXM interleaver matrix.

TABLE 6

PXM Interleaver Parameter Values for MP1X and 64QAM

| J | B | C | $I_0$ | N |
|---|---|---|---|---|
| 24 | 16 | 18 | 0 | 221184 |

The backup partition assignment vector $v_B$ directs encoded bits into the backup interleaver matrix (PXB) using the parameters shown in Table 7 below. Using these parameters, the PXB interleaver matrix is a 64-row by 432-column matrix. The sequence may be dispersed over the full row and column span of the PXB interleaver matrix.

TABLE 7

PXB Interleaver Parameter Values for MP1X and 64QAM

| J | B | C | $I_0$ | N |
|---|---|---|---|---|
| 24 | 2 | 18 | 0 | 27648 |

MP3X Service Mode

In the MP3X service mode, Layer 1 generates an extended hybrid FM IBOC radio signal that is backward compatible with existing service mode MP3, and includes multiple OFDM subcarriers in the upper primary main (PM) and primary extended (PX) sidebands, and the lower PM and PX sidebands. The multiple subcarriers in the upper and lower PM sidebands each form ten frequency partitions. To increase capacity over the MP3 service mode, 38 additional subcarriers are added to each of the upper and lower PX sidebands of the MP3X service mode. The 38 subcarriers are arranged into two additional frequency partitions (19 subcarriers per partition) in each of the upper and lower PX sidebands for a total of four additional frequency partitions.

In the MP3X service mode, the PM sidebands are mapped to the P1 and PIDS logical channels, and the PX sidebands are mapped to the P3 and P4 logical channels. Only logical channels P1, P3, and PIDS are active in the legacy MP3 service mode. Since MP3X is a backward-compatible service mode, new FM IBOC receivers tuned to a radio station broadcasting new service mode MP3X would receive not only the original P1, P3, and PIDS logical channels, but also the additional capacity of the P4 logical channel. Legacy receivers tuned to a radio station broadcasting new service mode MP1X would continue to receive the P1, P3, and PIDS logical channels as if service mode MP3 were being transmitted. FIG. 13 is a block diagram of an example of a portion of the stages used to prepare input P4 bits for transmitting service mode MP3X.

FIG. 20 is a table showing the FEC puncture pattern for the MP3X service mode when 4-QAM is used. As with MP1X, in the MP3X service mode with 4-QAM modulation, each of the main and backup (or upper and lower) code partitions generate four bits of encoded information for every three input bits. Using all code partitions, the composite code generates eight FEC encoded bits for every three information bits. The puncture pattern in FIG. 20 assigns the non-punctured bits to either a main (M) encoded component of the FEC encoder or a backup (B) encoded component. For MP3X with 4-QAM, main vector $v_M$=[0, 2, 1, 3, 3, 1, 2, 0], and backup vector $v_B$=[3, 2, 0, 1, 3, 1, 2, 0].

After FEC encoding and puncturing, the encoded bits are provided to the interleaver stage. Encoded bits from the P4 logical channel are interleaved in the PX interleaver matrix, while the PIDS logical channel is interleaved with the P1 logical channel in the PM interleaver matrix, and the P3 logical channel is interleaved in the PX1 interleaver matrix. The transfer frame characteristics for the interleaver for the PX sideband are summarized in the Table of FIG. 21 for the MP3X service mode with 4-QAM.

In the MP3X service mode, the P4 logical channel feeds two interleaver components: the main (PXM) and the backup (PXB), which are eventually mapped to the Inphase (I) and Quadrature (Q) symbol constellation components, respectively. Main encoded components are interleaved in main interleaver matrix PXM, and backup encoded components—after the application of diversity delay—are interleaved in backup interleaver matrix PXB.

The interleaver equations are identical to those used in service mode MP1X. In the MP3X service mode with 4-QAM, the main partition assignment vector $v_M$ directs encoded bits into the main interleaver matrix (PXM) using the parameters shown in Table 8 below. Using these parameters, the PXM interleaver matrix is a 512-row by 72-column matrix. The input encoded bit sequence may be dispersed over the full row and column span of the PXM interleaver matrix.

TABLE 8

PXM Interleaver Parameter Values for MP3X and 4-QAM

| J | B | C | $I_0$ | N |
|---|---|---|---|---|
| 4 | 16 | 18 | 0 | 36864 |

The backup partition assignment vector $v_B$ likewise directs encoded bits into the PX backup (PXB) interleaver matrix using the parameters shown in Table 9 below. The PXB interleaver matrix is a 64-row by 72-column matrix. The input encoded bit sequence may be dispersed over the full row and column span of the PXB interleaver matrix.

TABLE 9

PXB Interleaver Parameter Values for MP3X and 4-QAM

| J | B | C | $I_0$ | N |
|---|---|---|---|---|
| 4 | 2 | 18 | 0 | 4608 |

Following interleaving, the main and backup PX interleavers can be combined into a single composite interleaver matrix before mapping the interleaver contents to OFDM subcarriers. The lower numbered interleaver partitions (starting at 0) generally can be mapped to the lower sidebands, and the higher numbered partitions generally can be mapped to the upper sidebands. FIG. 19 is a Table showing an example of mapping interleaver partitions to frequency partitions for the PX sidebands in service mode MP3X with 4-QAM modulation.

After assigning interleaver partitions to frequency partitions, the bits of the interleaver matrices from all active sidebands can be transferred in parallel to the OFDM subcarrier mapping stage, which maps a row of bits from each interleaver matrix to the OFDM subcarriers. The bits in the main and backup interleavers can be mapped generally to the Inphase (I) and Quadrature (Q) constellation axes, respectively, of the OFDM subcarriers. The output of the OFDM subcarrier mapping stage is a frequency-domain representation of the OFDM symbol. OFDM modulation can then be performed to create a complex, baseband, time domain pulse representing the digital portion of the IBOC signal for that particular symbol.

The MP3X service mode can transfer data at 18 kbps using 4-QAM. This throughput can be doubled (to 36 kbps) or nearly tripled (to 48 kbps) at the expense of robustness using modulation types 16-QAM or 64-QAM, respectively.

FIG. 22 is a Table showing an example of interleaver-partition to frequency-partition mapping for the MP3X service mode with 16-QAM. Compared to the 4-QAM example, for 16 QAM there are twice as many interleaver partitions as frequency partitions. The TO frequency partitions in FIG. 22 show an MSB interleaver partition and an LSB interleaver partition assigned to each frequency partition to permit mapping from twice as many interleaver partitions. Thus, there are two I bits and two Q bits assigned to each OFDM subcarrier in each OFDM symbol (instead of just one for 4-QAM), resulting in 16 constellation points.

FIG. 23 is a Table showing the FEC puncture pattern for the MP3X service mode when 16-QAM is used. The puncture pattern assigns the non-punctured bits to either a main (M) encoded component of the FEC encoder or a backup (B) encoded component. The number of columns is the same as in the 4-QAM example, but there are twice as many interleaver partitions to which the bits are directed. For MP3X with 16-QAM, main vector $v_M$=[2, 4, 3, 5, 7, 1, 6, 0] and backup vector $v_B$=[7, 5, 1, 3, 6, 2, 4, 0]. Each of the main and backup (or upper and lower) code partitions generate four bits of encoded information for every three input bits. Using all code partitions, the composite code generates eight FEC encoded bits for every three input bits.

In the MP3X service mode with 16-QAM, the main partition assignment vector $v_M$ directs encoded bits into the main interleaver matrix (PXM) using the parameters shown in Table 10 below. Using these parameters, the PXM interleaver matrix is a 512-row by 144-column matrix. The input encoded bit sequence may be dispersed over the full row and column span of the PXM interleaver matrix.

TABLE 10

PXM Interleaver Parameter Values for MP3X and 16-QAM

| J | B | C | $I_0$ | N |
|---|---|---|---|---|
| 8 | 16 | 18 | 0 | 73728 |

The backup partition assignment vector $v_B$ directs encoded bits into the PXB interleaver matrix using the parameters shown in Table 11 below. Using these parameters, the PXB interleaver matrix is a 64-row by 144-column matrix. The input encoded bit sequence may be dispersed over the full row and column span of the PXB interleaver matrix.

TABLE 11

PXB Interleaver Parameter Values for MP3X and 16-QAM

| J | B | C | $I_0$ | N |
|---|---|---|---|---|
| 8 | 2 | 18 | 0 | 9216 |

TABLE 11-continued

PXB Interleaver Parameter Values for MP3X and 16-QAM

| J | B | C | $I_0$ | N |
|---|---|---|---|---|

Modulation type 64-QAM can also be used in the MP3X service mode. FIG. 24 is a Table showing an example of interleaver-partition to frequency-partition mapping for the MP3X service mode with 64-QAM. The TO frequency partitions in FIG. 24 show MSB, XSB, and LSB interleaver partitions assigned to each frequency partition to permit mapping from three times as many interleaver partitions as the 4-QAM case. Thus, there are three I bits and three Q bits assigned to each OFDM subcarrier in each OFDM symbol (instead of just one for 4-QAM), resulting in 64 constellation points.

FIG. 25 is a Table showing the FEC puncture pattern for the MP3X service mode when 64-QAM is used. Note that there are eight columns for the 64-QAM case, versus only six columns for the 4-QAM and 16-QAM examples. For MP3X with 64-QAM, main vector $v_M$=[6, 1, 2, 7, 5, 10, 9, 0, 3, 8, 4, 11] and backup vector $v_B$=[1, 6, 10, 5, 0, 7, 2, 9, 1, 4, 3, 8]. Each of the main and backup (or upper and lower) code partitions generate three bits of encoded information for every two input bits. Using all code partitions, the composite code generates three FEC encoded bits for every one input bit.

In the MP3X service mode with 64-QAM, the main partition assignment vector $v_M$ directs encoded bits into the main interleaver matrix (PXM) using the parameters shown in Table 12 below. Using these parameters, the PXM interleaver matrix is a 512-row by 216-column matrix. The input encoded bit sequence may be dispersed over the full row and column span of the PXM interleaver matrix.

TABLE 12

PXM Interleaver Parameter Values for MP3X and 64-QAM

| J | B | C | $I_0$ | N |
|---|---|---|---|---|
| 12 | 16 | 18 | 0 | 110592 |

The backup partition assignment vector $v_B$ directs encoded bits into the PXB interleaver matrix using the parameters shown in Table 13 below. Using these parameters, the PXB interleaver matrix is a 64-row by 216-column matrix. The input encoded bit sequence may be dispersed over the full row and column span of the PXB interleaver matrix.

TABLE 13

PXB Interleaver Parameter Values for MP3X and 64-QAM

| J | B | C | $I_0$ | N |
|---|---|---|---|---|
| 12 | 2 | 18 | 0 | 13824 |

DSB1 Service Mode

Figures 28, 29:
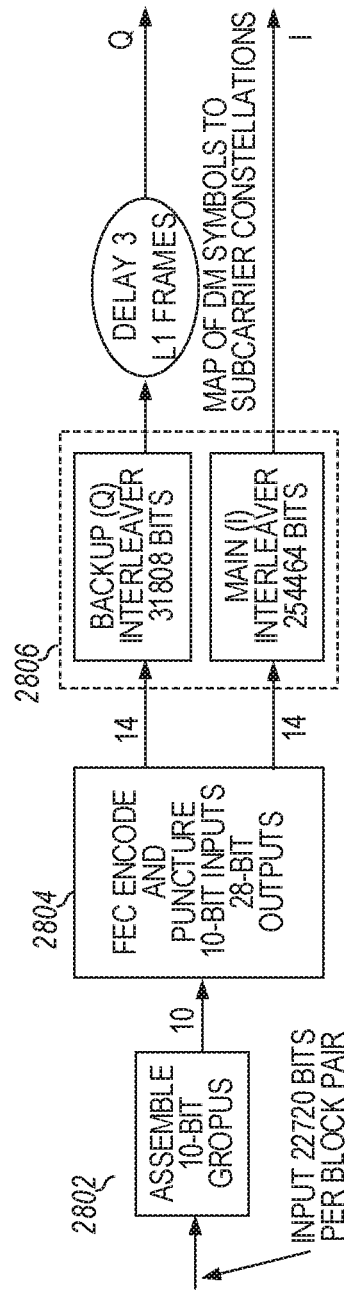
FIG. 28 is a block diagram of an example of a portion of the circuit stages used to prepare information bits of the P1 logical channel for transmitting in the DSB1 service mode with 4-QAM.
FIG. 29 is a Table of transfer frame characteristics for the interleaver for the PB sideband for the DSB1 service mode (4-QAM).
Figures 30, 31:
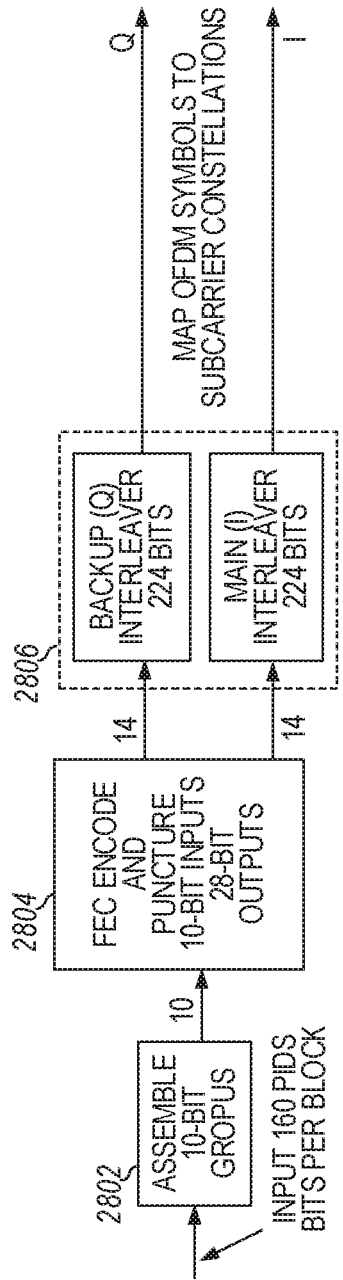
FIG. 30 is a block diagram of an example of a portion of the circuit stages used to prepare information bits of the primary IBOC data service (PIDS) logical channel for transmitting in the DSB1 service mode with 4-QAM.
FIG. 31 is a Table showing an example of frequency-partition mapping for the DSB1 service mode with 16-QAM.

In the DSB1 service mode, Layer 1 generates an extended hybrid or all digital FM IBOC radio signal that is not backward compatible with existing service modes. Thus, only new receivers tuned to a radio station broadcasting service mode DSB1 would be able to decode the FM IBOC signal. It includes multiple OFDM subcarriers in the upper and lower primary sidebands, forming fourteen frequency partitions on each sideband. In the DSB1 service mode, the upper and lower primary sidebands are mapped to the P1 and PIDS logical channels. FIG. 28 and FIG. 30 are block diagrams of an example of a portion of the stages used to prepare input P1 and PIDS bits, respectively, for transmitting service mode DSB1 with 4-QAM.

FIG. 27 is a table showing the FEC puncture pattern for the DSB1 service mode when 4-QAM is used. Each of the main and backup (or upper and lower) code partitions generate seven bits of encoded information for every five input bits. Using all code partitions, the composite code generates fourteen FEC-encoded bits for every five input bits. The puncture pattern in FIG. 27 assigns the non-punctured bits to either a main (M) encoded component of the FEC encoder or a backup (B) encoded component. For DSB1 with 4-QAM, main vector $v_M$=[11, 2, 25, 9, 14, 20, 5, 13, 1, 26, 19, 16, 22, 7, 10, 3, 24, 8, 15, 21, 4, 12, 0, 27, 18, 17, 23, 6], and backup vector $v_B$=[20, 16, 25, 22, 13, 2, 7, 19, 14, 26, 9, 11, 1, 5, 21, 17, 24, 23, 12, 3, 6, 18, 15, 27, 8, 10, 0, 4].

After FEC encoding and puncturing, the encoded bits are provided to the interleaver stage. Encoded bits from the P1 and PIDS logical channels are interleaved in the PB interleaver matrices. The transfer frame characteristics for the interleavers for the PB sidebands are summarized in the Table of FIG. 29 for the DSB1 service mode with 4-QAM.

In the DSB1 service mode, the P1 and PIDS logical channels feed two interleaver components: the main (PB-M) and the backup (PB-BU), which are eventually mapped to the Inphase (I) and Quadrature (Q) symbol constellation components, respectively. Main encoded components are interleaved in main interleaver matrix PB-M, and backup encoded components—after the application of diversity delay for the P1 logical channel—are interleaved in backup interleaver matrix PB-BU. Vectors $v_M$ and $v_B$ consist of the interleaver partition assignments for each main and backup code bit, respectively.

The interleaver equations are identical to those used in service modes MP1X and MP3X. In the DSB1 service mode with 4-QAM, the main partition assignment vector $v_M$ directs encoded P1 bits into the main interleaver matrix (PB-M) using the parameters shown in Table 14 below. Using these parameters, the PB-M interleaver matrix is a 512-row by 504-column matrix. The input encoded bit sequence may be dispersed over the full row and column span of the PB-M interleaver matrix, leaving holes to be filled by PIDS data.

TABLE 14

PB-M Interleaver Parameter Values for DSB1 and 4-QAM

| J | B | C | $I_0$ | N |
|---|---|---|---|---|
| 28 | 16 | 18 | 0 | 254464 |

The backup partition assignment vector $v_B$ likewise directs encoded P1 bits into the PB backup (PB-BU) interleaver matrix using the parameters shown in Table 15 below. The PB-BU interleaver matrix is a 64-row by 504-column matrix. The input encoded bit sequence may be dispersed over the full row and column span of the PB-BU interleaver matrix, leaving holes to be filled by PIDS data.

TABLE 15

PB-BU Interleaver Parameter Values for DSB1 and 4-QAM

| J | B | C | $I_0$ | N |
|---|---|---|---|---|
| 28 | 2 | 18 | 0 | 31808 |

In the DSB1 service mode with 4-QAM, each PIDS transfer frame is interleaved into PB-M and PB-BU using the parameters shown in Table 16. This interleaving is performed twice—once for PB-M (I bits) and once for PB-BU (Q bits)—for each interleaver block. The row span of each interleaved PIDS transfer frame is one interleaver block (32 rows). The PIDS-I and PIDS-Q components of the encoded PIDS bits are placed in the appropriate interleaver using the $v_M$ vector and the $v_B$ vector for the PB-M and PB-BU interleaver matrices, respectively.

TABLE 16

PB-M and PB-BU Interleaver Parameter Values for PIDS Logical Channel in DSB1 with 4-QAM

| J | B | C | $I_0$ | N |
|---|---|---|---|---|
| 28 | 1 | 18 | 15904 | 224 |

Following interleaving, the main and backup PB interleavers can be combined into a single composite interleaver matrix before mapping the interleaver contents to OFDM subcarriers. The lower numbered interleaver partitions (starting at 0) generally can be mapped to the lower sidebands, and the higher numbered partitions generally can be mapped to the upper sidebands. FIG. 26 is a Table showing an example of mapping interleaver partitions to frequency partitions for the PB sidebands in service mode DSB1 with 4-QAM.

After assigning interleaver partitions to frequency partitions, the bits of the interleaver matrices from all active sidebands can be transferred in parallel to the OFDM subcarrier mapping stage, which maps a row of bits from each interleaver matrix to the OFDM subcarriers. The bits in the main and backup interleavers can be mapped generally to the Inphase (I) and Quadrature (Q) constellation axes, respectively, of the OFDM subcarriers. The output of the OFDM subcarrier mapping stage is a frequency-domain representation of the OFDM symbol. OFDM modulation can then be performed to create a complex, baseband, time domain pulse representing the digital portion of the IBOC signal for that particular symbol.

The DSB1 service mode can transfer data at 120 kbps using 4-QAM. This throughput can be doubled (to 240 kbps) or nearly tripled (to 336 kbps) at the expense of robustness using modulation types 16-QAM or 64-QAM, respectively.

FIG. 31 is a Table showing an example of interleaver-partition to frequency-partition mapping for the DSB1 service mode with 16-QAM. Compared to the 4-QAM example, for 16 QAM there are twice as many interleaver partitions as frequency partitions. The T0 frequency partitions in FIG. 31 show MSB and LSB interleaver partitions assigned to each frequency partition to permit mapping from twice as many interleaver partitions. Thus, there are two I bits and two Q bits assigned to each OFDM subcarrier in each OFDM symbol (instead of just one for 4-QAM), resulting in 16 constellation points.

FIG. 32 is a Table showing the FEC puncture pattern for the DSB1 service mode when 16-QAM is used. The puncture pattern assigns the non-punctured bits to either a main (M) encoded component of the FEC encoder or a backup (B) encoded component. The number of columns is double the number of columns in the 4-QAM example. For DSB1 with 16-QAM, main vector $v_M$=[22, 4, 49, 18, 28, 40, 8, 26, 0, 53, 39, 32, 45, 14, 21, 7, 50, 17, 29, 42, 10, 25, 2, 52, 37, 34, 46, 12, 23, 5, 51, 19, 31, 41, 11, 27, 1, 54, 36, 33, 44, 13, 20, 6, 48, 16, 30, 43, 9, 24, 3, 55, 38, 35, 47, 15], and backup vector $v_B$=[40, 32, 49, 45, 26, 4, 14, 39, 28, 53, 18, 22, 0, 8, 42, 34, 50, 46, 25, 7, 12, 37, 29, 52, 17, 21, 2, 10, 41, 33, 51, 44, 27, 5, 13, 36, 31, 54, 19, 23, 1, 11, 43, 35, 48, 47, 24, 6, 15, 38, 30, 55, 16, 20, 3, 9]. Each of the main and backup (or upper and lower) code partitions generate seven bits of encoded information for every five input bits. Using all code partitions, the composite code generates fourteen FEC encoded bits for every five input bits.

In the DSB1 service mode with 16-QAM, the main partition assignment vector i; directs encoded P1 bits into the main interleaver matrix (PB-M) using the parameters shown in Table 17 below. Using these parameters, the PB-M interleaver matrix is a 512-row by 1008-column matrix. The input encoded bit sequence may be dispersed over the full row and column span of the PB-M interleaver matrix, leaving holes to be filled by PIDS data.

TABLE 17

PB-M Interleaver Parameter Values for DSB1 and 16-QAM

| J | B | C | $I_0$ | N |
|---|---|---|---|---|
| 56 | 16 | 18 | 0 | 508928 |

The backup partition assignment vector $v_B$ likewise directs encoded bits into the PB-BU interleaver matrix using the parameters shown in Table 18 below. Using these parameters, the PB-BU interleaver matrix is a 64-row by 1008-column matrix. The input encoded bit sequence may be dispersed over the full row and column span of the PB-BU interleaver matrix, leaving holes to be filled by PIDS data.

TABLE 18

PB-BU Interleaver Parameter Values for DSB1 and 16-QAM

| J | B | C | $I_0$ | N |
|---|---|---|---|---|
| 56 | 2 | 18 | 0 | 63616 |

In the DSB1 service mode with 16-QAM, each PIDS transfer frame is interleaved into PB-M and PB-BU using the parameters shown in Table 19. This interleaving is performed twice—once for PB-M (I bits) and once for PB-BU (Q bits)—for each interleaver block. The PIDS-I and PIDS-Q components of the encoded PIDS bits are placed in the appropriate interleaver using the vi vector and the $v_B$ vector for the PB-M and PB-BU interleaver matrices, respectively.

TABLE 19

PB-M and PB-BU Interleaver Parameter Values for PIDS Logical Channel in DSB1 with 16-QAM

| J | B | C | $I_0$ | N |
|---|---|---|---|---|
| 56 | 1 | 18 | 31808 | 448 |

FIG. 33 is a Table showing an example of interleaver-partition to frequency-partition mapping for the DSB1 service mode with 64-QAM. Compared to the 4-QAM example, for 64 QAM there are three times as many interleaver partitions as frequency partitions. The TO frequency partitions in FIG. 33 show MSB, XSB, and LSB interleaver partitions assigned to each frequency partition to permit mapping from three times as many interleaver partitions. Thus, there are three I bits and three Q bits assigned to each OFDM subcarrier in each OFDM symbol (instead of just one for 4-QAM), resulting in 64 constellation points.

FIG. 34 is a Table showing the FEC puncture pattern for the DSB1 service mode when 64-QAM is used. The puncture pattern assigns the non-punctured bits to either a main (M) encoded component of the FEC encoder or a backup (B) encoded component. The number of columns (56) is nearly triple the number of columns (20) in the 4-QAM example. For DSB1 with 64-QAM, main vector $v_M$=[42, 2, 22, 43, 34, 83, 46, 13, 18, 58, 33, 73, 67, 4, 27, 48, 40, 70, 59, 9, 17, 61, 32, 80, 65, 12, 15, 68, 29, 81, 49, 11, 25, 51, 39, 77, 55, 3, 19, 60, 36, 72, 62, 8, 21, 63, 31, 74, 64, 7, 16, 66, 30, 75, 57, 6, 14, 56, 28, 79, 69, 5, 26, 50, 41, 71, 52, 0, 24, 53, 38, 78, 54, 10, 20, 47, 37, 82, 45, 1, 23, 44, 35, 76], and backup vector $v_B$=[16, 42, 83, 34, 22, 43, 6, 46, 73, 33, 19, 58, 1, 67, 70, 40, 14, 48, 17, 59, 80, 32, 9, 61, 25, 65, 81, 29, 12, 68, 4, 49, 77, 39, 15, 51, 8, 55, 72, 36, 18, 60, 20, 62, 74, 31, 21, 63, 23, 64, 75, 30, 24, 66, 26, 57, 79, 28, 27, 56, 5, 69, 71, 41, 13, 50, 11, 52, 78, 38, 10, 53, 0, 54, 82, 37, 3, 47, 2, 45, 76, 35, 7, 44]. Each of the main and backup (or upper and lower) code partitions generate three bits of encoded information for every two input bits. Using all code partitions, the composite code generates three FEC encoded bits for every one input bit.

In the DSB1 service mode with 64-QAM, the main partition assignment vector $v_M$ directs encoded P1 bits into the main interleaver matrix (PB-M) using the parameters shown in Table 20 below. Using these parameters, the PB-M interleaver matrix is a 512-row by 1512-column matrix. The input encoded bit sequence may be dispersed over the full row and column span of the PB-M interleaver matrix, leaving holes to be filled by PIDS data.

TABLE 20

PB-M Interleaver Parameter Values for DSB1 and 64-QAM

| J | B | C | $I_0$ | N |
|---|---|---|---|---|
| 84 | 16 | 18 | 0 | 763392 |

The backup partition assignment vector $v_B$ likewise directs encoded bits into the PB-BU interleaver matrix using the parameters shown in Table 21 below. Using these parameters, the PB-BU interleaver matrix is a 64-row by 1512-column matrix. The input encoded bit sequence may be dispersed over the full row and column span of the PB-BU interleaver matrix, leaving holes to be filled by PIDS data.

TABLE 21

PB-BU Interleaver Parameter Values for DSB1 and 64-QAM

| J | B | C | $I_0$ | N |
|---|---|---|---|---|
| 84 | 2 | 18 | 0 | 95424 |

In the DSB1 service mode with 64-QAM, each PIDS transfer frame is interleaved into PB-M and PB-BU using the parameters shown in Table 22. This interleaving is performed twice—once for PB-M (I bits) and once for PB-BU (Q bits)—for each interleaver block. The PIDS-I and PIDS-Q components of the encoded PIDS bits are placed in the appropriate interleaver using the $v_M$ vector and the $v_B$ vector for the PB-M and PB-BU interleaver matrices, respectively.

TABLE 22

PB-M and PB-BU Interleaver Parameter Values for PIDS Logical Channel in DSB1 with 64-QAM

| J | B | C | $I_0$ | N |
|---|---|---|---|---|
| 84 | 1 | 18 | 47712 | 672 |

SSB1 Service Mode

Like DSB1, the SSB1 service mode is an extended hybrid FM IBOC radio signal that is not backward compatible with existing service modes. Thus, only new receivers tuned to a radio station broadcasting service mode SSB1 would be able to decode the FM IBOC signal. Service mode SSB1 is identical to service mode DSB1, except it has only one primary sideband. As such, it includes multiple OFDM subcarriers in either the upper or lower primary sideband, forming fourteen frequency partitions. In the SSB1 service mode, the single primary sideband is mapped to the P1 and PIDS logical channels.

FIG. 36 is a table showing the FEC puncture pattern for the SSB1 service mode when 4-QAM is used. Even though SSB1 uses only a single primary digital sideband, it still employs frequency diversity between upper and lower frequency partitions within the sideband. Each of the main and backup (or upper and lower) code partitions generate seven bits of encoded information for every five input bits. Using all code partitions, the composite code generates fourteen FEC-encoded bits for every five input bits. The puncture pattern in FIG. 36 assigns the non-punctured bits to either a main (M) encoded component of the FEC encoder or a backup (B) encoded component. For SSB1 with 4-QAM, main vector $v_M$=[5, 1, 12, 4, 7, 10, 2, 6, 0, 13, 9, 8, 11, 3], and backup vector $v_B$=[10, 8, 12, 11, 6, 1, 3, 9, 7, 13, 4, 5, 0, 2].

After FEC encoding and puncturing, the encoded bits are provided to the interleaver stage. Encoded bits from the P1 and PIDS logical channels are interleaved in the PB interleaver matrices. The transfer frame characteristics for the interleavers for the PB sideband are summarized in the Table of FIG. 37 for the SSB1 service mode with 4-QAM.

In the SSB1 service mode, the P1 and PIDS logical channels feed two interleaver components: the main (PB-M) and the backup (PB-BU), which are eventually mapped to the Inphase (I) and Quadrature (Q) symbol constellation components, respectively. Main encoded components are interleaved in main interleaver matrix PB-M, and backup encoded components—after the application of diversity delay for the P1 logical channel—are interleaved in backup interleaver matrix PB-BU. Vectors $v_M$ and $v_B$ consist of the interleaver partition assignments for each main and backup code bit, respectively.

The interleaver equations are identical to those used in service modes MP1X, MP3X, and DSB1. In the SSB1 service mode with 4-QAM, the main partition assignment vector $v_M$ directs encoded P1 bits into the main interleaver matrix (PB-M) using the parameters shown in Table 23 below. Using these parameters, the PB-M interleaver matrix is a 512-row by 252-column matrix. The input encoded bit sequence may be dispersed over the full row and column span of the PB-M interleaver matrix, leaving holes to be filled by PIDS data.

TABLE 23

PB-M Interleaver Parameter Values for SSB1 and 4-QAM

| J | B | C | $I_0$ | N |
|---|---|---|---|---|
| 14 | 16 | 18 | 0 | 127232 |

The backup partition assignment vector $v_B$ likewise directs encoded P1 bits into the PB backup (PB-BU) interleaver matrix using the parameters shown in Table 24 below. The PB-BU interleaver matrix is a 64-row by 252-column matrix. The input encoded bit sequence may be dispersed over the full row and column span of the PB-BU interleaver matrix, leaving holes to be filled by PIDS data.

TABLE 24

PB-BU Interleaver Parameter Values for SSB1 and 4-QAM

| J | B | C | $I_0$ | N |
|---|---|---|---|---|
| 14 | 2 | 18 | 0 | 15904 |

In the SSB1 service mode with 4-QAM, each PIDS transfer frame is interleaved into PB-M and PB-BU using the parameters shown in Table 25. This interleaving is performed twice—once for PB-M (I bits) and once for PB-BU (Q bits)—for each interleaver block. The row span of each interleaved PIDS transfer frame is one interleaver block (32 rows). The PIDS-I and PIDS-Q components of the encoded PIDS bits are placed in the appropriate interleaver using the vu vector and the $v_B$ vector for the PB-M and PB-BU interleaver matrices, respectively.

TABLE 25

PB-M and PB-BU Interleaver Parameter Values for PIDS Logical Channel in SSB1 with 4-QAM

| J | B | C | $I_0$ | N |
|---|---|---|---|---|
| 14 | 1 | 18 | 7952 | 112 |

Following interleaving, the main and backup PB interleavers can be combined into a single composite interleaver matrix before mapping the interleaver contents to OFDM subcarriers. FIG. 35 is a Table showing an example of mapping interleaver partitions to frequency partitions for the PB sidebands in service mode SSB1 with 4-QAM modulation. Although the example in FIG. 35 shows the interleaver partitions mapped to the lower primary sideband, this is not necessary; they could also be mapped to the upper primary sideband.

After assigning interleaver partitions to frequency partitions, the bits of the interleaver matrices from all active sidebands can be transferred in parallel to the OFDM subcarrier mapping stage, which maps a row of bits from each interleaver matrix to the OFDM subcarriers. The bits in the main and backup interleavers can be mapped generally to the Inphase (I) and Quadrature (Q) constellation axes, respectively, of the OFDM subcarriers. The output of the OFDM subcarrier mapping stage is a frequency-domain representation of the OFDM symbol. OFDM modulation can then be performed to create a complex, baseband, time-domain pulse representing the digital portion of the IBOC signal for that particular symbol.

The SSB1 service mode can transfer data at 60 kbps using 4-QAM. This throughput can be doubled (to 120 kbps) or nearly tripled (to 168 kbps) at the expense of robustness using modulation types 16-QAM or 64-QAM, respectively.

FIG. 38 is a Table showing an example of interleaver-partition to frequency-partition mapping for the SSB1 service mode with 16-QAM. Compared to the 4-QAM example, for 16 QAM there are twice as many interleaver partitions as frequency partitions. The TO frequency partitions in FIG. 38 show MSB and LSB interleaver partitions assigned to each frequency partition to permit mapping from twice as many interleaver partitions. Thus, there are two I bits and two Q bits assigned to each OFDM subcarrier in each OFDM symbol (instead of just one for 4-QAM), resulting in 16 constellation points.

FIG. 39 is a Table showing the FEC puncture pattern for the SSB1 service mode when 16-QAM is used. The puncture pattern assigns the non-punctured bits to either a main (M) encoded component of the FEC encoder or a backup (B) encoded component. The number of columns is double the number of columns in the 4-QAM example. For SSB1 with 16-QAM, main vector $v_M$=[11, 2, 25, 9, 14, 20, 5, 13, 1, 26, 19, 16, 22, 7, 10, 3, 24, 8, 15, 21, 4, 12, 0, 27, 18, 17, 23, 6], and backup vector $v_B$=[20, 16, 25, 22, 13, 2, 7, 19, 14, 26, 9, 11, 1, 5, 21, 17, 24, 23, 12, 3, 6, 18, 15, 27, 8, 10, 0, 4]. Each of the main and backup (or upper and lower) code partitions generate seven bits of encoded information for every five input bits. Using all code partitions, the composite code generates fourteen FEC encoded bits for every five input bits.

In the SSB1 service mode with 16-QAM, the main partition assignment vector $v_M$ directs encoded P1 bits into the main interleaver matrix (PB-M) using the parameters shown in Table 26 below. Using these parameters, the PB-M interleaver matrix is a 512-row by 504-column matrix. The input encoded bit sequence may be dispersed over the full row and column span of the PB-M interleaver matrix, leaving holes to be filled by PIDS data.

TABLE 26

PB-M Interleaver Parameter Values for SSB1 and 16-QAM

| J | B | C | $I_0$ | N |
|---|---|---|---|---|
| 28 | 16 | 18 | 0 | 254464 |

The backup partition assignment vector $v_B$ likewise directs encoded bits into the PB-BU interleaver matrix using the parameters shown in Table 27 below. Using these parameters, the PB-BU interleaver matrix is a 64-row by 504-column matrix. The input encoded bit sequence may be dispersed over the full row and column span of the PB-BU interleaver matrix, leaving holes to be filled by PIDS data.

TABLE 27

PB-BU Interleaver Parameter Values for SSB1 and 16-QAM

| J | B | C | $I_0$ | N |
|---|---|---|---|---|
| 28 | 2 | 18 | 0 | 31808 |

TABLE 27-continued

PB-BU Interleaver Parameter Values for SSB1 and 16-QAM

| J | B | C | $I_0$ | N |
|---|---|---|---|---|

In the SSB1 service mode with 16-QAM, each PIDS transfer frame is interleaved into PB-M and PB-BU using the parameters shown in Table 28. This interleaving is performed twice—once for PB-M (I bits) and once for PB-BU (Q bits)—for each interleaver block. The PIDS-I and PIDS-Q components of the encoded PIDS bits are placed in the appropriate interleaver using the $v_M$ vector and the $v_B$ vector for the PB-M and PB-BU interleaver matrices, respectively.

TABLE 28

PB-M and PB-BU Interleaver Parameter Values for PIDS Logical Channel in SSB1 with 16-QAM

| J | B | C | $I_0$ | N |
|---|---|---|---|---|
| 28 | 1 | 18 | 15904 | 224 |

FIG. 40 is a Table showing an example of interleaver-partition to frequency-partition mapping for the SSB1 service mode with 64-QAM. Compared to the 4-QAM example, for 64 QAM there are three times as many interleaver partitions as frequency partitions. The TO frequency partitions in FIG. 40 show MSB, XSB, and LSB interleaver partitions assigned to each frequency partition to permit mapping from three times as many interleaver partitions. Thus, there are three I bits and three Q bits assigned to each OFDM subcarrier in each OFDM symbol (instead of just one for 4-QAM), resulting in 64 constellation points.

FIG. 41 is a Table showing the FEC puncture pattern for the SSB1 service mode when 64-QAM is used. The puncture pattern assigns the non-punctured bits to either a main (M) encoded component of the FEC encoder or a backup (B) encoded component. The number of columns (28) is nearly triple the number of columns (10) in the 4-QAM example. For SSB1 with 64-QAM, main vector $v_M$=[21, 2, 11, 22, 17, 37, 24, 4, 10, 30, 16, 41, 34, 1, 13, 25, 20, 40, 31, 6, 8, 32, 15, 38, 33, 0, 7, 29, 14, 36, 26, 5, 12, 27, 19, 35, 28, 3, 9, 23, 18, 39], and backup vector $v_B$=[2, 21, 37, 17, 7, 22, 4, 24, 41, 16, 8, 30, 13, 34, 40, 20, 6, 25, 3, 31, 38, 15, 9, 32, 11, 33, 36, 14, 12, 29, 1, 26, 35, 19, 5, 27, 10, 28, 39, 18, 0, 23]. Each of the main and backup (or upper and lower) code partitions generate three bits of encoded information for every two input bits. Using all code partitions, the composite code generates three FEC encoded bits for every one input bit.

In the SSB1 service mode with 64-QAM, the main partition assignment vector $v_M$ directs encoded P1 bits into the main interleaver matrix (PB-M) using the parameters shown in Table 29 below. Using these parameters, the PB-M interleaver matrix is a 512-row by 756-column matrix. The input encoded bit sequence may be dispersed over the full row and column span of the PB-M interleaver matrix, leaving holes to be filled by PIDS data.

TABLE 29

PB-M Interleaver Parameter Values for SSB1 and 64-QAM

| J | B | C | $I_0$ | N |
|---|---|---|---|---|
| 42 | 16 | 18 | 0 | 381696 |

TABLE 29-continued

PB-M Interleaver Parameter Values for SSB1 and 64-QAM

| J | B | C | $I_0$ | N |
|---|---|---|---|---|

The backup partition assignment vector $v_B$ likewise directs encoded bits into the PB-BU interleaver matrix using the parameters shown in Table 30 below. Using these parameters, the PB-BU interleaver matrix is a 64-row by 756-column matrix. The input encoded bit sequence may be dispersed over the full row and column span of the PB-BU interleaver matrix, leaving holes to be filled by PIDS data.

TABLE 30

PB-BU Interleaver Parameter Values for SSB1 and 64-QAM

| J | B | C | $I_0$ | N |
|---|---|---|---|---|
| 42 | 2 | 18 | 0 | 47712 |

In the SSB1 service mode with 64-QAM, each PIDS transfer frame is interleaved into PB-M and PB-BU using the parameters shown in Table 31. This interleaving is performed twice—once for PB-M (I bits) and once for PB-BU (Q bits)—for each interleaver block. The PIDS-I and PIDS-Q components of the encoded PIDS bits are placed in the appropriate interleaver using the $v_M$ vector and the $v_B$ vector for the PB-M and PB-BU interleaver matrices, respectively.

TABLE 31

PB-M and PB-BU Interleaver Parameter Values for PIDS Logical Channel in SSB1 with 64-QAM

| J | B | C | $I_0$ | N |
|---|---|---|---|---|
| 42 | 1 | 18 | 23856 | 336 |

MS5 Secondary Service Mode

As shown in FIGS. 10A and 10B, there can be six secondary logical channels in the FM IBOC radio system that can be designated as S1, S2, S3, S4, S5, and SIDS. Secondary service modes are only available in an all-digital FM IBOC radio signal, and can be used to configure the secondary logical channels. A new LUMB secondary service mode is designated as MS5.

As explained previously herein, the all-digital FM IBOC radio signal can include lower-power secondary digital sidebands in the spectrum vacated by the analog signal. In the MS5 secondary service mode, each secondary sideband can include fourteen upper secondary frequency partitions and fourteen lower secondary frequency partitions. In the MS5 service mode, the S4 and SIDS secondary logical channels are mapped to the secondary sidebands.

The MS5 secondary service mode uses 4-QAM modulation and uses the same FEC encoding, puncturing, and interleaving as primary service mode DSB1. One difference between the DSB1 service mode and the MS5 service mode is that the upper and lower secondary sideband mapping is swapped when compared to the upper and lower primary sidebands in service mode DSB1. The MS5 processing circuitry places two additional secondary reference subcarriers at OFDM subcarrier numbers −1 and +1 (reference subcarriers 29 and 31, respectively), near the center of the channel vacated by the analog signal. Reference subcarrier 30 (OFDM subcarrier number 0) is unpopulated, as are OFDM subcarriers −268 to −279 and 268-279.

FIG. 43 is a Table showing the FEC puncture pattern for the MS5 secondary service mode. The puncture pattern is identical to the DSB1 puncture pattern for 4-QAM. The rows of the table are the outputs of the three generator polynomials of the convolutional code G. Vector $v_M$ is formed with 28 of the non-punctured code bits from the Table that have an M designation in the Table (e.g., $v_M$=[11, 2, 25, 9, 14, 20, 5, 13, 1, 26, 19, 16, 22, 7, 10, 3, 24, 8, 15, 21, 4, 12, 0, 27, 18, 17, 23, 6]). Vector $v_B$ is formed using the B code bits in the Table (e.g., $v_B$=[20, 16, 25, 22, 13, 2, 7, 19, 14, 26, 9, 11, 1, 5, 21, 17, 24, 23, 12, 3, 6, 18, 15, 27, 8 10, 0, 4]). In the MS5 service mode with 4-QAM modulation, each of the main and backup components include seven bits of encoded information for every five input bits. Together, the two components generate fourteen FEC encoded bits for every five input bits.

After FEC encoding and puncturing, the encoded bits are provided to the interleaver stage. Encoded bits from the S4 and SIDS logical channels are interleaved in the SB interleaver matrices. The transfer frame characteristics for the interleavers for the SB sidebands are summarized in the Table of FIG. 44 for the MS5 service mode with 4-QAM.

In the MS5 service mode, the S4 and SIDS logical channels feed two interleaver components: the main (SB-M) and the backup (SB-BU), which are eventually mapped to the Inphase (I) and Quadrature (Q) symbol constellation components, respectively. Main encoded components are interleaved in main interleaver matrix SB-M, and backup encoded components—after application of diversity delay for the S4 logical channel—are interleaved in backup interleaver matrix SB-BU. Vectors $v_M$ and $v_B$ consist of the interleaver partition assignments for each main and backup code bit, respectively.

In the MS5 service mode with 4-QAM, the main partition assignment vector $v_M$ directs encoded S4 bits into the main interleaver matrix (SB-M) using the parameters shown in Table 32 below. Using these parameters, the SB-M interleaver matrix is a 512-row by 504-column matrix. The input encoded bit sequence may be dispersed over the full row and column span of the SB-M interleaver matrix, leaving holes to be filled by SIDS data.

TABLE 32

SB-M Interleaver Parameter Values for S4 Logical Channel in MS5

| J | B | C | $I_0$ | N |
|---|---|---|---|---|
| 28 | 16 | 18 | 0 | 254464 |

The backup partition assignment vector $v_B$ likewise directs encoded S4 bits into the SB backup (SB-BU) interleaver matrix using the parameters shown in Table 33 below. The SB-BU interleaver matrix is a 64-row by 504-column matrix. The input encoded bit sequence may be dispersed over the full row and column span of the SB-BU interleaver matrix, leaving holes to be filled by SIDS data.

TABLE 33

SB-BU Interleaver Parameter Values for S4 Logical Channel in MS5

| J | B | C | $I_0$ | N |
|---|---|---|---|---|
| 28 | 2 | 18 | 0 | 31808 |

TABLE 33-continued

SB-BU Interleaver Parameter Values for S4 Logical Channel in MS5

| J | B | C | $I_0$ | N |
|---|---|---|---|---|

In the MS5 secondary service mode, the SIDS logical channel is interleaved in the same manner that the PIDS logic channel is interleaved in the DSB1 primary service mode. Each SIDS transfer frame is interleaved into SB-M and SB-BU using the parameters shown in Table 34. This interleaving is performed twice—once for SB-M (I bits) and once for SB-BU (Q bits)—for each Interleaver Block. The row span of each interleaved SIDS transfer frame is one interleaver block (32 rows). The SIDS-I and SIDS-Q components of the encoded SIDS bits are placed in the appropriate interleaver using the $v_M$ vector and the $v_B$ vector for SIDS-I and SIDS-Q, respectively.

TABLE 34

SB-M and SB-BU Interleaver Parameter Values for SIDS Logical Channel in MS5

| J | B | C | $I_0$ | N |
|---|---|---|---|---|
| 28 | 1 | 18 | 15904 | 224 |

Following interleaving, the main and backup SB interleavers can be combined into a single composite interleaver matrix before mapping the interleaver contents to OFDM subcarriers. FIG. 42 is a Table showing an example of mapping interleaver partitions to frequency partitions for the SB sidebands in service mode MS5. For service Mode MS5—unlike primary service mode DSB1 and other LUMB service modes—lower numbered interleaver partitions are mapped to the upper sidebands, and higher numbered interleaver partitions are mapped to the lower sidebands.

After assigning interleaver partitions to frequency partitions, the bits of the interleaver matrices from all active sidebands (primary and secondary) can be transferred in parallel to the OFDM subcarrier mapping stage, which maps a row of bits from each interleaver matrix to the OFDM subcarriers. The bits in the main and backup interleavers can be mapped generally to the Inphase (I) and Quadrature (Q) constellation axes, respectively, of the OFDM subcarriers. The output of the OFDM subcarrier mapping stage is a frequency-domain representation of the OFDM symbol. OFDM modulation can then be performed to create a complex, baseband, time domain pulse representing the digital portion of the IBOC signal for that particular symbol. The MS5 service mode can transfer data at 120 kbps.

Layer 2 PDU Modifications

The new MP1X, MP3X, DSB1, SSB1 and MS5 service modes use new FEC encoding, puncture patterns, and interleavers. MP1X and MP3X are backward compatible with existing MP1 and MP3 service modes, respectively. All of the service modes provide multi-dimensional LUMB diversity for improved performance in fading and channel outages. The new primary service modes use 4-QAM, 16-QAM, and 64-QAM, which can offer increased throughput. Increased throughput may require a tradeoff with signal robustness, providing flexibility to the radio broadcaster. Modifying the protocol data unit (PDU) used to transfer the logical channels between Layer 2 and Layer 1 can also improve system robustness.

Figures 44, 45:
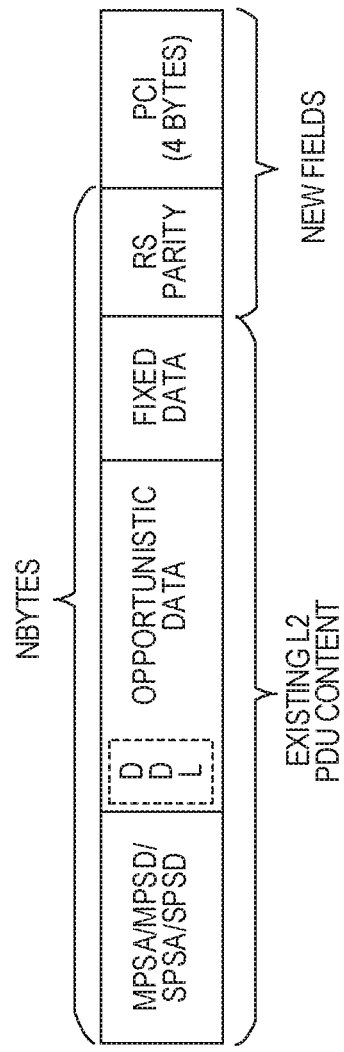
FIG. 44 is a Table of transfer frame characteristics for the interleaver for the SB sideband for the MS5 secondary service mode (4-QAM).
FIG. 45 is a diagram of a Layer 2 protocol data unit (PDU) for use with Lower-Upper-Main-Backup (LUMB) service modes.

FIG. 45 is a diagram of an L2 PDU that can be used with new LUMB service modes. The PDU can be used for the primary logical channels or the secondary logical channels. The PDU includes an MPSA/MPSD/SPSA/SPSD field for main program service audio (MPSA), main program service data (MPSD), supplemental program service audio (SPSA), or supplemental program service data (SPSD). The PDU also includes a field for opportunistic data, and a field for fixed data. The PDU may include a data delimiter (DDL) between the MPSA/MPSD/SPSA/SPSD field and the opportunistic data field. The example of FIG. 45 shows the PDU with possible content options, but the PDU may include subsets of the fields shown.

The PDU also includes a multi-byte (e.g., 4-byte) program control information (PCI) field at the end of the PDU, and a Reed Solomon (RS) Parity field. The RS Parity Field immediately precedes the PCI field in the example and accommodates the parity bytes of a concatenated systematic RS FEC code for additional error correction capability. The concatenated code maintains the PDU payload while accommodating additional FEC coding over the entire PDU for increased robustness.

The PCI field identifies the information content of the PDU. A 32-bit PCI field can be generated using a punctured Hadamard (n=32, k=6) block code. This Hadamard code uses six bits of PCI Identification information as in the PCI_ID vector shown below.

$$PCI\_ID = (b_5 b_4 b_3 b_2 b_1 b_0)$$

The six-bit PCI_ID field creates 64 possible valid punctured Hadamard codewords. In some examples, eight valid PDU content identifiers (e.g., PCI codewords $CW_0$ through $CW_7$) can be generated by the three lower bits ($b_2$, $b_1$, $b_0$) of the six PCI Identification bits. The three upper bits ($b_5$, $b_4$, $b_3$) can be used for future expansion of PCI codewords. An example of eight PCI codewords is shown in Table 35 below.

TABLE 35

PCI Codewords.

| PCI Codeword | PCI Identification Bits $b_2$, $b_1$, $b_0$ | MPSA/MPSD/ SPSA/SPSD | Fixed Data | Opportunistic Data |
|---|---|---|---|---|
| $CW_0$ | 0 0 0 | Yes | No | No |
| $CW_1$ | 0 0 1 | Yes | No | Yes |
| $CW_2$ | 0 1 0 | Yes | Yes | No |
| $CW_3$ | 0 1 1 | Yes | Yes | Yes |
| $CW_4$ | 1 0 0 | No | Yes | No |
| $CW_5$ | 1 0 1 | Reserved | Reserved | Reserved |
| $CW_6$ | 1 1 0 | Reserved | Reserved | Reserved |
| $CW_7$ | 1 1 1 | Reserved | Reserved | Reserved |

PCI Encoding

Figures 46, 47:
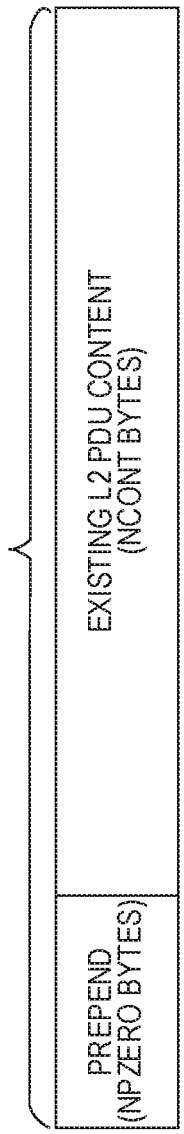
FIG. 46 is the punctured Hadamard code Generator matrix.
FIG. 47 shows the content field of a Layer 2 PDU.

To encode the PCI Identification bits using a punctured Hadamard code, the multi-byte PCI Field can be generated as the product of the 6-bit PCI Identification Bits row vector PCI_ID and the generator matrix Gen_PCI, or PCI_Field=PCI_ID×Gen_PCL FIG. 46 shows the punctured Hadamard Generator matrix Gen_PCI. As an example, if a PDU including both MPSA and Fixed Data content is associated with the PCI Identification row vector $$PCI\_ID = (0\ 0\ 0\ 0\ 1\ 0)$$

then the PCI Field resulting from the product of PCI_ID and Gen. PCI is

PCI_Field=(0011001100110011001100110011)

RS Parity Field Encoding

FIG. 47 is a diagram of a portion of the PDU. The RS Parity field consists of the RS parity bytes generated by the systematic "content" portions of the RS codewords that span the PDU content immediately preceding the RS Parity field, as shown in FIG. 45. The number of bytes spanning the entire PDU (prior to FEC convolutional encoding) is defined as the Backup Transfer Frame size associated with the LUMB logical channel. This number of bytes, available for the PDU contents (MPSA/MPSD/SPSA/SPSD, Opportunistic Data, and Fixed Data) plus the RS Parity and PCI Fields, minus the 4 bytes to accommodate the PCI Field, is denoted as Nbytes.

The RS Parity field, having 16 parity bytes per RS codeword, is generated after first defining the LUMB service mode (e.g., the DSB1 service mode) to determine the PDU size (N Backup Transfer Frame bits) and FEC convolutional code rate R. The following expressions can be used to define the RS encoding process.

If the number of bits in the Backup Transfer Frame (including PCI bits) after convolutional encoding (Rate R) is N, then the number of uncoded bytes per Transfer Frame (excluding PCI, before convolutional coding), Nbytes, is $$Nbytes = \frac{N}{8} \cdot 2 \cdot R - 4.$$

The number of RS codewords per Transfer Frame (Nrs) is $$Nrs = \text{ceil}\left(\frac{Nbytes}{255}\right).$$

The total number of content bytes per transfer frame (Ncont) is $Ncont = Nbytes - 16 \cdot Nrs.$ The number of bytes per RS codeword (RSbytes) is $$RSbytes = \text{ceil}\left(\frac{Nbytes}{Nrs}\right).$$

The number of Prepend zero bytes (NPzero) is $NPzero = Nrs \cdot RSbytes - Nbytes.$ As shown in FIG. 47, the content field of the PDU is prepended by NPzero zero bytes to prepare the content field for interleaving prior to RS encoding. The Prepend is not transmitted, but used only to facilitate RS interleaving and encoding. It should be noted that this RS interleaving is different from the interleaving of the main and backup components described previously. The resulting number of bytes in the prepended content field Pcontent is an integer multiple of the number of RS codewords (Nrs). This interleaving segments the prepended content into Nrs systematic components of equal size (RSbytes-16).

The systematic (Pcontent) portion of the codewords is formatted using the following interleaver expression:

$RSsys_{n,k} = Pcontent_{n+k \cdot Nrs}; n=0 \ldots RSbytes-17, k=0 \ldots Nrs-1,$ where RSsys is a matrix of the Pcontent (systematic) bytes of the codewords. There are Nrs column vectors, one for each codeword. Each column vector of RSsys is input to a Reed Solomon encoder RS(RSbytes,RSbytes-16,GF($2^8$)) to generate a 16-byte parity result RSP for each of the Nrs codewords.

$RSpar_{k+16 \cdot n} = RSP_{n,k}; n=0 \ldots 15, k=0 \ldots Nrs-1,$ where $RSP_{n,k}$ is the nth byte (n=0 . . . 15) of the kth (k=0 . . . Nrs-1) parity result RSP.

The 16 parity bytes for each RS codeword are generated by dividing the RS systematic component by the RS generator polynomial over GF($2^8$). The parity bytes for the codeword comprise the remainder of the polynomial division. These RS codewords are considered "shortened" since the number of bytes in each codeword is generally less than 255 for Galois Field ($2^8$), or GF($2^8$). Note that any prepended zero bytes at the start of the RSys codewords do not change the polynomial division parity results (RSP) for the shortened codewords. The purpose of prepending is to facilitate convenient interleaving of equal size codewords.

The RS code is a standard code defined over GF($2^8$). This code is defined by its primitive polynomial and generator polynomial. The primitive polynomial is $p(x) = x^8 + x^4 + x^3 + x^2 + 1$, or 100011101 in binary notation, where the LSB is on the right. The generator polynomial is $$g_{16}(x) = a^{136} + a^{240}x + a^{208}x^2 + a^{195}x^3 + a^{181}x^4 +$$
$$a^{158}x^5 + a^{201}x^6 + a^{100}x^7 + a^{11}x^8 + a^{83}x^9 + a^{167}x^{10} +$$
$$a^{107}x^{11} + a^{113}x^{12} + a^{110}x^{13} + a^{106}x^{14} + a^{121}x^{15} + x^{16}.$$

where "a" is a root of the primitive polynomial.

Table 36 below compares logical channel parameters for the primary LUMB service modes. The concatenated systematic RS FEC code maintains intact PDU payload while accommodating additional FEC encoding over the entire PDU for increased robustness.

TABLE 36

| LUMB Logical Channel Parameters (16 Parity Bytes per RS Codeword) | | | | | | |
|---|---|---|---|---|---|---|
| Service Mode | Nbytes | R(convolutional)/ Reff | Nrs | Ncont | NPzero | RSbytes | Throughput (kbps) |
| DSB1_QPSK | 2836 | 5/14/0.333 | 12 | 2644 | 8 | 237 | 114 |
| DSB1_16QAM | 5676 | 5/14/0.334 | 23 | 5308 | 5 | 247 | 229 |
| DSB1_64QAM | 7948 | 1/3/0.312 | 32 | 7436 | 20 | 249 | 320 |
| SSB1_QPSK | 1416 | 5/14/0.333 | 6 | 1320 | 0 | 236 | 57 |
| SSB1_16QAM | 2386 | 5/14/0.333 | 12 | 2644 | 8 | 237 | 114 |

TABLE 36-continued

LUMB Logical Channel Parameters (16 Parity Bytes per RS Codeword)

| Service Mode | Nbytes | R(convolutional)/ Reff | Nrs | Ncont | NPzero | RSbytes | Throughput (kbps) |
|---|---|---|---|---|---|---|---|
| SSB1_64QAM | 3972 | 1/3/0.312 | 16 | 3716 | 12 | 249 | 160 |
| MP1X_QPSK | 860 | 3/8/0.347 | 4 | 796 | 0 | 215 | 34 |
| MP1X_16QAM | 1724 | 3/8/0.351 | 7 | 1612 | 5 | 247 | 69 |
| MP1X_64QAM | 2300 | 1/3/0.310 | 10 | 2140 | 0 | 230 | 92 |
| MP3X_QPSK | 428 | 3/8/0.347 | 2 | 396 | 0 | 214 | 17 |
| MP3X_16QAM | 860 | 3/8/0.347 | 4 | 796 | 0 | 215 | 34 |
| MP3X_64QAM | 1148 | 1/3/0.310 | 5 | 1068 | 2 | 230 | 46 |

The systems, devices, and methods described provide new LUMB service modes for FM IBOC radio transmissions. The service modes increase capacity through the use of QAM and improve signal robustness via frequency diversity between upper and lower sidebands and time diversity between main and backup components. The LUMB service modes can provide support for emerging technologies not possible with current service modes.

Additional Examples and Disclosure

Example 1 is a radio transmitter comprising: transmitting circuitry configured to broadcast a frequency modulation (FM) in-band on-channel (IBOC) radio signal, wherein the FM IBOC radio signal includes, multiple subcarriers grouped into multiple frequency partitions; and processing circuitry configured to: receive input bits for transmitting; encode the input bits using forward error correction (FEC) encoding; distribute encoded input bits between a main encoded component and a backup encoded component, wherein encoded bits of the backup encoded component are delayed for a specified duration relative to encoded bits of the main encoded component; allocate the encoded input bits of the main and backup encoded components into frequency diverse sidebands of the FM IBOC radio signal; and modulate the encoded input bits for transmitting using the frequency diverse sidebands of the FM IBOC radio signal, wherein the modulation is a type of quadrature amplitude modulation (QAM).

In Example 2, the subject matter of Example 1 includes, wherein the processing circuitry is configured to: allocate each encoded bit of the main encoded component to a main interleaver partition of a main interleaver matrix according to an FEC puncture pattern; interleave the encoded bits within each main interleaver partition across both time and frequency according to one or more interleaver equations; allocate each encoded bit of the backup encoded component to a backup interleaver partition of a backup interleaver matrix according to the FEC puncture pattern; and interleave the encoded bits within each backup interleaver partition across both time and frequency according to one or more interleaver equations.

In Example 3, the subject matter of Example 2 includes, wherein the processing circuitry is configured to: combine the main interleaved encoded bits and the backup interleaved encoded bits into corresponding interleaver partitions of a composite interleaver matrix; assign each composite interleaver partition to a frequency partition according to a frequency partition map; and assign rows of the frequency partitions to respective orthogonal frequency division multiplexed (OFDM) symbols.

In Example 4, the subject matter of Examples 1-3 includes, wherein the frequency diverse sidebands include upper and lower sidebands and the FEC encoding includes a Complementary Punctured Pair Convolutional (CPPC) code, the CPPC code including an FEC convolutional code punctured into code partitions for the upper and lower sidebands and the main and backup encoded components.

In Example 5, the subject matter of Example 4 includes, wherein the processing circuitry is configured to: generate an FM IBOC waveform that is backward compatible with existing service mode MP1, having ten upper primary main frequency partitions, and ten lower primary main frequency partitions; partition new multiple subcarriers into four upper primary extended frequency partitions, and four lower primary extended frequency partitions, wherein all four of the upper primary extended frequency partitions and all four of the lower primary extended frequency partitions distribute encoded input bits between a main encoded component and a delayed backup encoded component; generate OFDM symbols wherein all primary extended frequency partitions are modulated using one of four point QAM (4-QAM) or sixteen point QAM (16-QAM); and generate eight encoded input bits for every three of the input bits mapped to the primary extended frequency partitions.

In Example 6, the subject matter of Examples 4-5 includes, wherein the processing circuitry is configured to: generate an FM IBOC waveform that is backward compatible with existing service mode MP1, having ten upper primary main frequency partitions, and ten lower primary main frequency partitions; partition new multiple subcarriers into four upper primary extended frequency partitions, and four lower primary extended frequency partitions, wherein all four of the upper primary extended frequency partitions and all four of the lower primary extended frequency partitions distribute encoded input bits between a main encoded component and a delayed backup encoded component; generate OFDM symbols wherein all primary extended frequency partitions are modulated using 64-point QAM (64-QAM); and generate three encoded input bits for every one of the input bits mapped to the primary extended frequency partitions.

In Example 7, the subject matter of Examples 4-6 includes, wherein the processing circuitry is configured to: generate an FM IBOC waveform that is backward compatible with existing service mode MP3, having ten upper primary main frequency partitions, two upper primary extended frequency partitions, ten lower primary main frequency partitions, and two lower primary extended frequency partitions; partition new multiple subcarriers into two additional upper primary extended frequency partitions, and two additional lower primary extended frequency partitions, wherein both of the additional upper primary extended frequency partitions and both of the additional lower primary extended frequency partitions distribute encoded input bits between a main encoded component and a delayed backup encoded component; generate OFDM symbols wherein both of the additional upper primary extended frequency partitions and both of the additional lower primary extended frequency partitions are modulated using one of four point QAM (4-QAM) or sixteen point QAM (16-QAM); and generate eight encoded input bits for every three of the input bits mapped to both of the additional upper primary extended frequency partitions and both of the additional lower primary extended frequency partitions.

In Example 8, the subject matter of Examples 4-7 includes, wherein the processing circuitry is configured to: generate an FM IBOC waveform that is backward compatible with existing service mode MP3, having ten upper primary main frequency partitions, two upper primary extended frequency partitions, ten lower primary main frequency partitions, and two lower primary extended frequency partitions; partition new multiple subcarriers into two additional upper primary extended frequency partitions, and two additional lower primary extended frequency partitions, wherein both of the additional upper primary extended frequency partitions and both of the additional lower primary extended frequency partitions distribute encoded input bits between a main encoded component and a delayed backup encoded component; generate OFDM symbols wherein both of the additional upper primary extended frequency partitions and both of the additional lower primary extended frequency partitions are modulated using 64-point QAM (64-QAM); and generate three encoded input bits for every one of the input bits mapped to both of the additional upper primary extended frequency partitions and both of the additional lower primary extended frequency partitions.

In Example 9, the subject matter of Examples 1-8 includes, wherein the processing circuitry is configured to: partition the multiple subcarriers into fourteen upper primary frequency partitions, and fourteen lower primary frequency partitions; generate OFDM symbols modulated using one of 4-QAM or 16-QAM; and generate fourteen encoded input bits for every five of the input bits.

In Example 10, the subject matter of Examples 1-9 includes, wherein the processing circuitry is configured to: partition the multiple subcarriers into fourteen upper primary frequency partitions, and fourteen lower primary frequency partitions; generate OFDM symbols modulated using 64-QAM; and generate three encoded input bits for every one of the input bits.

In Example 11, the subject matter of Examples 1-10 includes, wherein the processing circuitry is configured to: partition the multiple subcarriers into fourteen upper primary frequency partitions, or fourteen lower primary frequency partitions; generate OFDM symbols modulated using one of 4-QAM or 16-QAM; and generate fourteen encoded input bits for every five of the input bits.

In Example 12, the subject matter of Examples 1-11 includes, wherein the processing circuitry is configured to: partition the multiple subcarriers into fourteen upper primary frequency partitions, or fourteen lower primary frequency partitions; generate OFDM symbols modulated using 64-QAM; and generate three encoded input bits for every one of the input bits.

In Example 13, the subject matter of Examples 1-12 includes, wherein the FM IBOC radio signal is an all-digital FM IBOC radio signal and the processing circuitry is configured to partition the multiple subcarriers into upper and lower sidebands, and the upper and lower sidebands include fourteen upper primary frequency partitions, fourteen upper secondary frequency partitions, fourteen lower primary frequency partitions, and fourteen lower secondary frequency partitions.

In Example 14, the subject matter of Example 13 includes, wherein the all-digital FM IBOC radio signal replaces the spectral region of an analog FM radio signal with additional secondary subcarriers, and the processing circuitry is configured to: partition the additional secondary subcarriers into secondary frequency partitions, including fourteen upper secondary frequency partitions and fourteen lower secondary frequency partitions; generate OFDM symbols modulated using 4-QAM; and generate fourteen encoded input bits for every five of the input bits.

In Example 15, the subject matter of Examples 1-14 includes, wherein the processing circuitry is configured to: receive the input bits as information content bytes; encode the information content bytes using a concatenated systematic Reed Solomon (RS) FEC code to generate RS parity bytes; and place the information content bytes in a content field of a protocol data unit (PDU) and place the RS parity bytes in an RS parity field of the PDU.

In Example 16, the subject matter of Example 15 includes, wherein the information content bytes of the RS codewords are comprised of interleaved bytes of the input information content.

In Example 17, the subject matter of Examples 15-16 includes, wherein the processing circuitry is configured to place a program control information (PCI) codeword in a PCI field of the PDU.

In Example 18, the subject matter of Example 17 includes, wherein the PCI field is encoded using a Punctured Hadamard Code.

Example 19 is a method of controlling operation of a radio transmitter system to broadcast a frequency modulation (FM) in-band on-channel (IBOC) radio signal, the method comprising: receiving input bits for transmitting via the FM IBOC radio signal, wherein the FM IBOC radio signal includes, subcarriers grouped into multiple frequency partitions; encoding the input bits into encoded bits using forward error correction (FEC) encoding; distributing the encoded bits between a main encoded component and a backup encoded component, wherein encoded bits of the backup encoded component are delayed for a specified duration relative to encoded bits of the main encoded component; allocating the encoded bits into frequency diverse sidebands of the FM IBOC radio signal; modulating the encoded bits using a type of quadrature amplitude modulation (QAM); and transmitting modulated encoded bits as radio frequency (RF) data symbols via the frequency diverse sidebands of the FM IBOC radio signal.

In Example 20, the subject matter of Example 19 includes, allocating each encoded bit of the main encoded component to a main interleaver partition of a main interleaver matrix according to an FEC puncture pattern; interleaving the encoded bits within each main interleaver partition across both time and frequency according to one or more interleaver equations; allocating each encoded bit of the backup encoded component to a backup interleaver partition of a backup interleaver matrix according to the FEC puncture pattern; interleaving the encoded bits within each backup interleaver partition across both time and frequency according to one or more interleaver equations.

In Example 21, the subject matter of Example 20 includes, combining the main interleaved encoded bits and the backup interleaved encoded bits into corresponding multiple interleaver partitions of a composite interleaver matrix; assigning each composite interleaver partition to a frequency partition according to a frequency partition map; assigning each row of the frequency partitions to a corresponding orthogonal frequency division multiplexed (OFDM) symbol.

In Example 22, the subject matter of Examples 19-21 includes, partitioning the multiple subcarriers into ten upper primary main frequency partitions, four upper primary extended frequency partitions, ten lower primary main frequency partitions, and four lower primary extended frequency partitions; and wherein modulating the encoded bits includes generating OFDM symbols using one of four point QAM (4-QAM), sixteen point QAM (16-QAM), or sixty-four point QAM (64-QAM).

In Example 23, the subject matter of Examples 19-22 includes, partitioning the multiple subcarriers into fourteen upper primary frequency partitions, and fourteen lower primary frequency partitions; wherein modulating the encoded bits includes generating OFDM symbols modulated using one of 4-QAM or 16-QAM; and wherein encoding the input bits includes generating fourteen encoded input bits for every five of the input bits.

In Example 24, the subject matter of Examples 19-23 includes, partitioning the multiple subcarriers into fourteen upper primary frequency partitions, and fourteen lower primary frequency partitions; wherein modulating the encoded bits includes generating OFDM symbols modulated using 64-QAM; and wherein encoding the input bits includes generating three encoded input bits for every one of the input bits.

In Example 25, the subject matter of Examples 19-24 includes, partitioning the multiple subcarriers into fourteen upper primary frequency partitions, or fourteen lower primary frequency partitions; wherein modulating the encoded bits includes generating OFDM symbols modulated using one of 4-QAM or 16-QAM; and wherein encoding the input bits includes generating fourteen encoded input bits for every five of the input bits.

In Example 26, the subject matter of Examples 19-25 includes, partitioning the multiple subcarriers into fourteen upper primary frequency partitions, or fourteen lower primary frequency partitions; wherein modulating the encoded bits includes generating OFDM symbols modulated using 64-QAM; and wherein encoding the input bits includes generating three encoded input bits for every one of the input bits.

In Example 27, the subject matter of Examples 19-26 includes, wherein the FM IBOC radio signal is an all-digital FM IBOC radio signal, and the method further includes partitioning the multiple subcarriers into upper and lower sidebands, and the upper and lower sidebands includes fourteen upper primary frequency partitions, fourteen lower primary frequency partitions, fourteen upper secondary frequency partitions, and fourteen lower secondary frequency partitions.

In Example 28, the subject matter of Example 27 includes, wherein the all-digital FM IBOC radio signal replaces the spectral region of an analog FM radio signal with additional secondary subcarriers, and the method further includes: partitioning the additional secondary subcarriers into secondary frequency partitions, including fourteen upper secondary frequency partitions and fourteen lower secondary frequency partitions; generating OFDM symbols modulated using 4-QAM; and wherein encoding the input bits includes generating fourteen encoded input bits for every five of the input bits.

In Example 29, the subject matter of Examples 19-28 includes, wherein receiving input bits includes receiving the input bits as information content bytes; and wherein encoding the input bits includes: interleaving the information content bytes; encoding the interleaved information content bytes using a concatenated systematic Reed Solomon (RS) FEC code to generate RS parity bytes; placing the information content bytes in a content field of a protocol data unit (PDU); and placing the RS parity bytes in an RS parity field of the PDU.

In Example 30, the subject matter of Example 29 includes, encoding program control information (PCI) into a PCI codeword using a punctured Hadamard code, and placing the PCI codeword in the PCI field of the PDU.

These non-limiting examples can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, the subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope should be determined with reference to the appended claims, along with the full scope of equivalents to which such claims are entitled.

What is claimed is:

1. A radio transmitter comprising:
  transmitting circuitry configured to broadcast a frequency modulation (FM) in-band on-channel (IBOC) radio signal, wherein the FM IBOC radio signal includes multiple subcarriers grouped into multiple frequency partitions; and
  processing circuitry configured to:
    receive input bits for transmitting;
    encode the input bits using complementary punctured pair convolutional forward error correction (CPPC FEC) encoding and concatenated systematic Reed Solomon forward error correction (RS FEC) encoding;
    distribute the encoded input bits between a main encoded component and a backup encoded component, wherein the encoded bits of the backup encoded component are delayed for a specified duration relative to the encoded bits of the main encoded component;
    allocate the encoded input bits of the main and backup encoded components into frequency diverse sidebands of the FM IBOC radio signal; and
    modulate the encoded input bits for transmitting using the frequency diverse sidebands of the FM IBOC radio signal, wherein the modulation is one of four point quadrature amplitude modulation (4-QAM), sixteen point QAM (16-QAM) or sixty-four point QAM (64-QAM).

2. The radio transmitter of claim 1, wherein the processing circuitry is configured to:
  allocate each encoded bit of the main encoded component to a main interleaver partition of a main interleaver matrix according to an FEC puncture pattern;
  interleave the encoded bits within each main interleaver partition across both time and frequency according to one or more interleaver equations;
  allocate each encoded bit of the backup encoded component to a backup interleaver partition of a backup interleaver matrix according to the FEC puncture pattern; and
  interleave the encoded bits within each backup interleaver partition across both time and frequency according to one or more interleaver equations.

3. The radio transmitter of claim 2, wherein the processing circuitry is configured to:
  combine the main interleaved encoded bits and the backup interleaved encoded bits into corresponding interleaver partitions of a composite interleaver matrix;
  assign each composite interleaver partition to a frequency partition according to a frequency partition map; and
  assign rows of the frequency partitions to respective orthogonal frequency division multiplexed (OFDM) symbols.

4. The radio transmitter of claim 1, wherein the frequency diverse sidebands include upper and lower sidebands and the CPPC FEC encoding includes an FEC convolutional code punctured into code partitions for the upper and lower sidebands and the main and backup encoded components.

5. The radio transmitter of claim 4, wherein the processing circuitry is configured to:
  generate an FM IBOC waveform that is backward compatible with existing service mode MP1, having ten upper primary main frequency partitions, and ten lower primary main frequency partitions;
  partition new multiple subcarriers into four upper primary extended frequency partitions, and four lower primary extended frequency partitions, wherein all four of the upper primary extended frequency partitions and all four of the lower primary extended frequency partitions distribute encoded input bits between a main encoded component and a delayed backup encoded component;
  generate OFDM symbols wherein all primary extended frequency partitions are modulated using one of four point QAM (4-QAM) or sixteen point QAM (16-QAM); and
  generate eight encoded input bits for every three of the input bits mapped to the primary extended frequency partitions.

6. The radio transmitter of claim 4, wherein the processing circuitry is configured to:
  generate an FM IBOC waveform that is backward compatible with existing service mode MP1, having ten upper primary main frequency partitions, and ten lower primary main frequency partitions;
  partition new multiple subcarriers into four upper primary extended frequency partitions, and four lower primary extended frequency partitions, wherein all four of the upper primary extended frequency partitions and all four of the lower primary extended frequency partitions distribute encoded input bits between a main encoded component and a delayed backup encoded component;
  generate OFDM symbols wherein all primary extended frequency partitions are modulated using 64-point QAM (64-QAM); and
  generate three encoded input bits for every one of the input bits mapped to the primary extended frequency partitions.

7. The radio transmitter of claim 4, wherein the processing circuitry is configured to:
  generate an FM IBOC waveform that is backward compatible with existing service mode MP3, having ten upper primary main frequency partitions, two upper primary extended frequency partitions, ten lower primary main frequency partitions, and two lower primary extended frequency partitions;
  partition new multiple subcarriers into two additional upper primary extended frequency partitions, and two additional lower primary extended frequency partitions, wherein both of the additional upper primary extended frequency partitions and both of the additional lower primary extended frequency partitions distribute encoded input bits between a main encoded component and a delayed backup encoded component;
  generate OFDM symbols wherein both of the additional upper primary extended frequency partitions and both of the additional lower primary extended frequency partitions are modulated using one of four point QAM (4-QAM) or sixteen point QAM (16-QAM); and
  generate eight encoded input bits for every three of the input bits mapped to both of the additional upper primary extended frequency partitions and both of the additional lower primary extended frequency partitions.

8. The radio transmitter of claim 4, wherein the processing circuitry is configured to:
  generate an FM IBOC waveform that is backward compatible with existing service mode MP3, having ten upper primary main frequency partitions, two upper primary extended frequency partitions, ten lower primary main frequency partitions, and two lower primary extended frequency partitions;
  partition new multiple subcarriers into two additional upper primary extended frequency partitions, and two additional lower primary extended frequency partitions, wherein both of the additional upper primary extended frequency partitions and both of the additional lower primary extended frequency partitions distribute encoded input bits between a main encoded component and a delayed backup encoded component;

generate OFDM symbols wherein both of the additional upper primary extended frequency partitions and both of the additional lower primary extended frequency partitions are modulated using 64-point QAM (64-QAM); and generate three encoded input bits for every one of the input bits mapped to both of the additional upper primary extended frequency partitions and both of the additional lower primary extended frequency partitions.

9. The radio transmitter of claim 1, wherein the processing circuitry is configured to:
partition the multiple subcarriers into fourteen upper primary frequency partitions, and fourteen lower primary frequency partitions;
generate OFDM symbols modulated using one of 4-QAM or 16-QAM; and
generate fourteen encoded input bits for every five of the input bits.

10. The radio transmitter of claim 1, wherein the processing circuitry is configured to:
partition the multiple subcarriers into fourteen upper primary frequency partitions, and fourteen lower primary frequency partitions;
generate OFDM symbols modulated using 64-QAM; and
generate three encoded input bits for every one of the input bits.

11. The radio transmitter of claim 1, wherein the processing circuitry is configured to:
partition the multiple subcarriers into fourteen upper primary frequency partitions, or fourteen lower primary frequency partitions;
generate OFDM symbols modulated using one of 4-QAM or 16-QAM; and
generate fourteen encoded input bits for every five of the input bits.

12. The radio transmitter of claim 1, wherein the processing circuitry is configured to:
partition the multiple subcarriers into fourteen upper primary frequency partitions, or fourteen lower primary frequency partitions;
generate OFDM symbols modulated using 64-QAM; and
generate three encoded input bits for every one of the input bits.

13. The radio transmitter of claim 1, wherein the FM IBOC radio signal is an all-digital FM IBOC radio signal and the processing circuitry is configured to partition the multiple subcarriers into upper and lower sidebands, and the upper and lower sidebands include fourteen upper primary frequency partitions, fourteen upper secondary frequency partitions, fourteen lower primary frequency partitions, and fourteen lower secondary frequency partitions.

14. The radio transmitter of claim 13, wherein the all-digital FM IBOC radio signal replaces the spectral region of an analog FM radio signal with additional secondary subcarriers, and the processing circuitry is configured to:
partition the additional secondary subcarriers into secondary frequency partitions, including fourteen upper secondary frequency partitions and fourteen lower secondary frequency partitions;
generate OFDM symbols modulated using 4-QAM; and
generate fourteen encoded input bits for every five of the input bits.

15. The radio transmitter of claim 1, wherein the processing circuitry is configured to:
receive the input bits as information content bytes;
encode the information content bytes using the RS FEC encoding to generate RS parity bytes; and
place the information content bytes in a content field of a protocol data unit (PDU) and place the RS parity bytes in an RS parity field of the PDU.

16. The radio transmitter of claim 15, wherein the information content bytes of the RS codewords are comprised of interleaved bytes of the input information content.

17. The radio transmitter of claim 15, wherein the processing circuitry is configured to place a program control information (PCI) codeword in a PCI field of the PDU.

18. The radio transmitter of claim 17, wherein the PCI field is encoded using a Punctured Hadamard Code.

19. A method of controlling operation of a radio transmitter system to broadcast a frequency modulation (FM) in-band on-channel (IBOC) radio signal, the method comprising:
receiving input bits for transmitting via the FM IBOC radio signal, wherein the FM IBOC radio signal includes subcarriers grouped into multiple frequency partitions;
encoding the input bits into encoded bits using complementary punctured pair convolutional forward error correction (CPPC FEC) encoding and concatenated systematic Reed Solomon forward error correction (RS FEC) encoding;
distributing the encoded bits between a main encoded component and a backup encoded component, wherein the encoded bits of the backup encoded component are delayed for a specified duration relative to the encoded bits of the main encoded component;
allocating the encoded bits into frequency diverse sidebands of the FM IBOC radio signal;
modulating the encoded bits using one of four point quadrature amplitude modulation (4-QAM), sixteen point QAM (16-QAM) or sixty-four point QAM (64-QAM); and
transmitting modulated encoded bits as radio frequency (RF) data symbols via the frequency diverse sidebands of the FM IBOC radio signal.

20. The method of claim 19, including:
allocating each encoded bit of the main encoded component to a main interleaver partition of a main interleaver matrix according to an FEC puncture pattern;
interleaving the encoded bits within each main interleaver partition across both time and frequency according to one or more interleaver equations;
allocating each encoded hit of the backup encoded component to a backup interleaver partition of a backup interleaver matrix according to the FEC puncture pattern;
interleaving the encoded bits within each backup interleaver partition across both time and frequency according to one or more interleaver equations.

21. The method of claim 20, including:
combining the main interleaved encoded bits and the backup interleaved encoded bits into corresponding multiple interleaver partitions of a composite interleaver matrix;

assigning each composite interleaver partition to a frequency partition according to a frequency partition map;

assigning each row of the frequency partitions to a corresponding orthogonal frequency division multiplexed (OFDM) symbol.

22. The method of claim 19, including
partitioning the multiple subcarriers into ten upper primary main frequency partitions, four upper primary extended frequency partitions, ten lower primary main frequency partitions, and four lower primary extended frequency partitions; and wherein modulating the encoded bits includes generating OFDM symbols using one of four point QAM (4-QAM), sixteen point QAM (16-QAM), or sixty-four point QAM (64-QAM).

23. The method of claim 19, including:
partitioning the multiple subcarriers into fourteen upper primary frequency partitions, and fourteen lower primary frequency partitions;

wherein modulating the encoded bits includes generating OFDM symbols modulated using one of 4-QAM or 16-QAM; and wherein encoding the input bits includes generating fourteen encoded input bits for every five of the input bits.

24. The method of claim 19, including:
partitioning the multiple subcarriers into fourteen upper primary frequency partitions, and fourteen lower primary frequency partitions;

wherein modulating the encoded bits includes generating OFDM symbols modulated using 64-QAM; and wherein encoding the input bits includes generating three encoded input bits for every one of the input bits.

25. The method of claim 19, including:
partitioning the multiple subcarriers into fourteen upper primary frequency partitions, or fourteen lower primary frequency partitions;

wherein modulating the encoded bits includes generating OFDM symbols modulated using one of 4-QAM or 16-QAM, and wherein encoding the input bits includes generating fourteen encoded input bits for every five of the input bits.

26. The method of claim 19, including:
partitioning the multiple subcarriers into fourteen upper primary frequency partitions, or fourteen lower primary frequency partitions;

wherein modulating the encoded bits includes generating OFDM symbols modulated using 64-QAM; and wherein encoding the input bits includes generating three encoded input bits for every one of the input bits.

27. The method of claim 19, wherein the FM IBOC radio signal is an all-digital FM IBOC radio signal, and the method further includes partitioning the multiple subcarriers into upper and lower sidebands, and the upper and lower sidebands includes fourteen upper primary frequency partitions, fourteen lower primary frequency partitions, fourteen upper secondary frequency partitions, and fourteen lower secondary frequency partitions.

28. The method of claim 27, wherein the all-digital FM IBOC radio signal replaces the spectral region of an analog FM radio signal with additional secondary subcarriers, and the method further includes:

partitioning the additional secondary subcarriers into secondary frequency partitions, including fourteen upper secondary frequency partitions and fourteen lower secondary frequency partitions;

generating OFDM symbols modulated using 4-QAM; and wherein encoding the input bits includes generating fourteen encoded input bits for every five of the input bits.

29. The method of claim 19,
wherein receiving input bits includes receiving the input bits as information content bytes; and wherein encoding the input bits includes:
interleaving the information content bytes;
encoding the interleaved information content bytes using RS FEC encoding to generate RS parity bytes;
placing the information content bytes in a content field of a protocol data unit (PDU); and
placing the RS parity bytes in an RS parity field of the PDU.

30. The method of claim 29, including encoding program control information (PCI) into a PCI codeword using a punctured Hadamard code, and placing the PCI codeword in the PCI field of the PDU.

\* \* \* \* \*